United States Patent [19]

Shimizu et al.

[11] Patent Number: 5,521,735
[45] Date of Patent: May 28, 1996

[54] ELECTRON WAVE COMBINING/BRANCHING DEVICES AND QUANTUM INTERFERENCE DEVICES

[75] Inventors: Akira Shimizu, Inagi; Masahiro Okuda, Sagamihara; Kazuhito Fujii, Atsugi, all of Japan

[73] Assignee: Canon Kabushiki Kaisha, Tokyo, Japan

[21] Appl. No.: 166,351

[22] Filed: Dec. 14, 1993

Related U.S. Application Data

[63] Continuation of Ser. No. 739,258, Aug. 1, 1991, abandoned.

[30] Foreign Application Priority Data

| Aug. 9, 1990 | [JP] | Japan | 2-211254 |
| Aug. 14, 1990 | [JP] | Japan | 2-214813 |
| Sep. 3, 1990 | [JP] | Japan | 2-232756 |
| Sep. 21, 1990 | [JP] | Japan | 2-253012 |

[51] Int. Cl.⁶ ................................ H01L 29/15
[52] U.S. Cl. .................. 359/154; 257/24; 257/27; 359/189
[58] Field of Search ............ 357/4, 16; 359/154, 359/189; 257/14, 24, 26, 27

[56] References Cited

U.S. PATENT DOCUMENTS

| Re. 33,584 | 5/1991 | Mimura | 357/16 |
| Re. 33,671 | 8/1991 | Dingle | 357/16 |
| 4,550,330 | 10/1985 | Fowler | 357/16 |
| 4,829,534 | 5/1989 | Miyazawa et al. | 372/46 |
| 4,971,415 | 11/1990 | Hara et al. | 350/96.11 |
| 5,130,766 | 7/1992 | Arimoto et al. | 357/16 |

FOREIGN PATENT DOCUMENTS

| 63-93161 | 4/1988 | Japan . |
| 1129477 | 5/1989 | Japan . |
| 1226182 | 9/1989 | Japan . |
| 2130964 | 5/1990 | Japan . |
| 2200008 | 8/1990 | Japan . |

OTHER PUBLICATIONS

Akira Shimizu, et al. "Absorption-free modulation of electron-interference currents by optical fields using intersubband virtual transitions", Physical Review B (Condensed Matter), Rapid Communications, vol. 42, No. 14, pp. 9248–9251 (Nov. 15, 1990).

Masahiro Okuda, et al., "Novel electron interferometers using field-induced decoupling in double quantum well structures", Applied Physics Letters, vol. 57, No. 21, pp. 2231–2233 (Nov. 19, 1990).

S. Datta, et al., "Proposed structure for large quantum interference effects", Applied Physics Letters, vol. 48, No. 7, pp. 487–489 (Feb. 1986).

Hiroshi Okamoto, "Optical Physical Properties and Application of Superlattice", Corona Publishing Co., Ltd., pp. 10–11 (Oct. 25, 1988).

Supriyo Datta, "Quantum Interference Transistors", extended Abstracts of the 20th (1988 International) Conference on Solid State Devices and Materials, pp. 491–494 (Tokyo, 1988).

*Primary Examiner*—William D. Larkins
*Attorney, Agent, or Firm*—Fitzpatrick, Cella, Harper & Scinto

[57] ABSTRACT

Novel electron wave combining and/or branching devices and Aharonov-Bohm type quantum interference devices are proposed, which have no curved electron waveguide structures to form an electron branching or decoupling part or ring geometry. But instead the electron branching part or ring geometry is effectively constructed in a straight double quantum well structures, by the control of the shapes of the wave functions or of the subband energy levels relative to the Fermi level by electric fields.

23 Claims, 18 Drawing Sheets

ENERGY LEVEL
( FOR ELECTRONS )

LOCATION OF WAVEGUIDE IN PROPAGATION DIRECTION

DISTANCE BETWEEN ELECTRODES (μm)

FIG. 10A
COUPLED
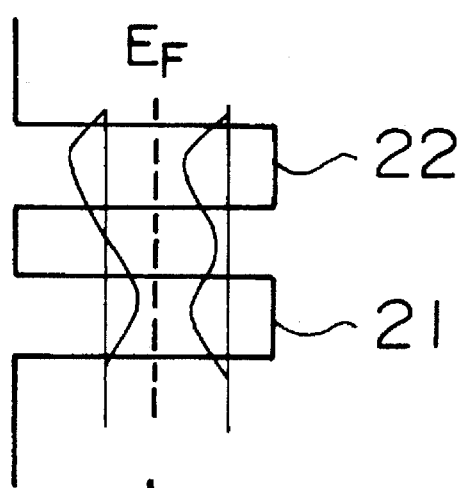
FIG. 10B
DECOUPLED
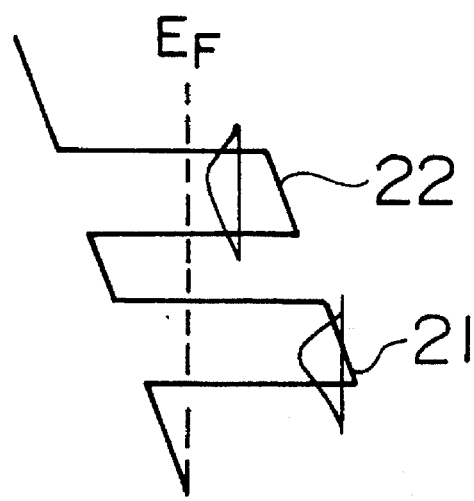
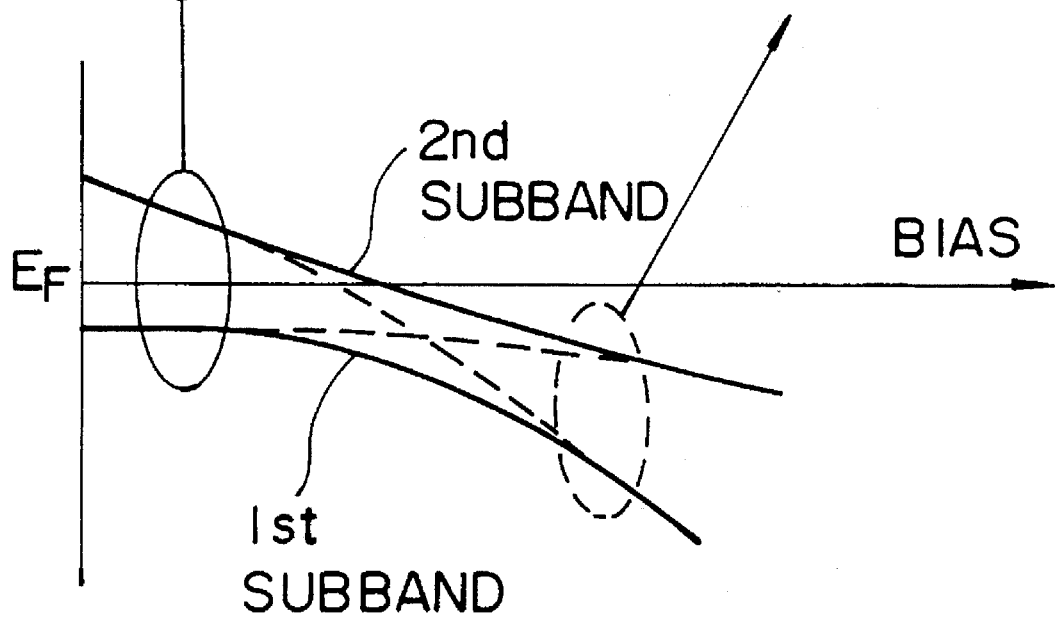
FIG. 10C

FIG. 21A
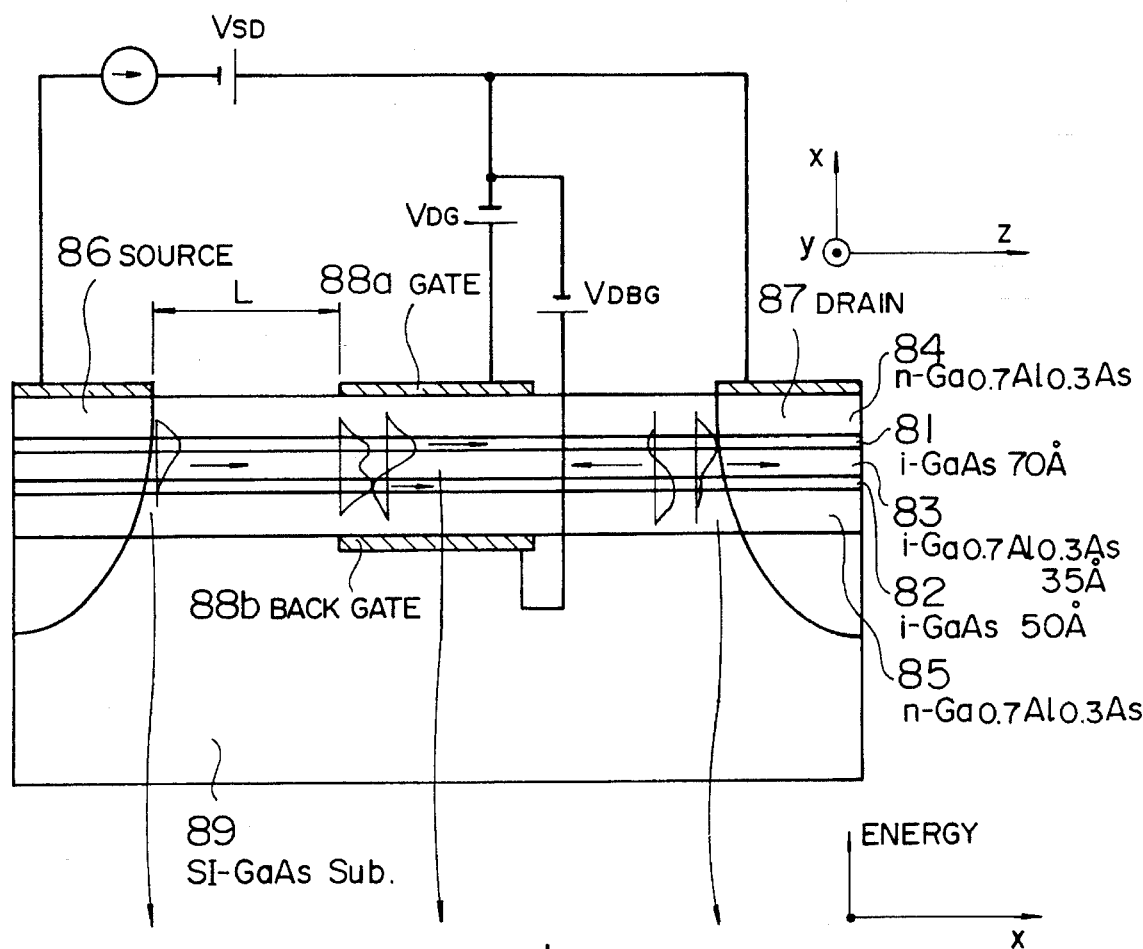
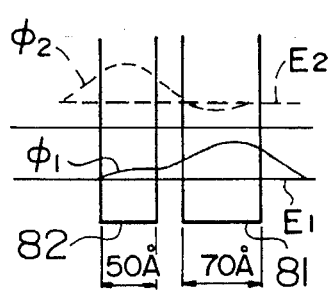
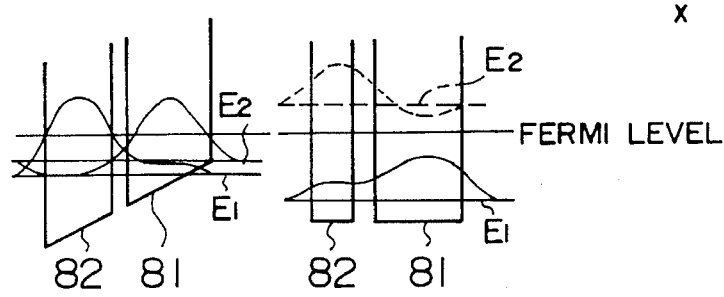
FIG. 21B     FIG. 21C     FIG. 21D

FIG. 24A
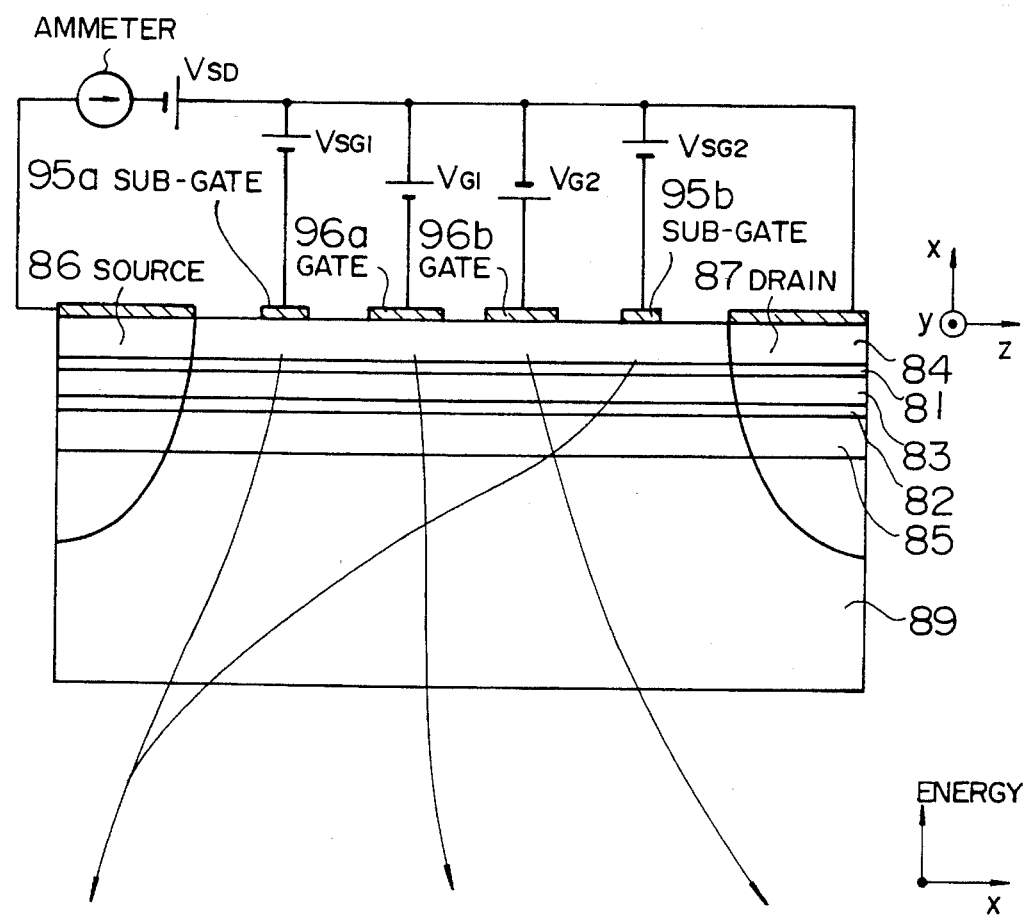
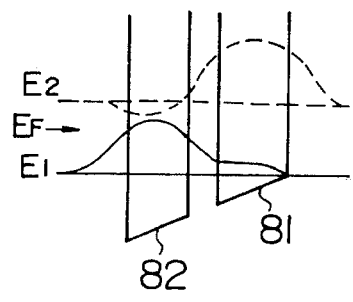
FIG. 24B
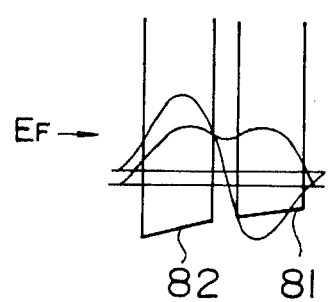
FIG. 24C
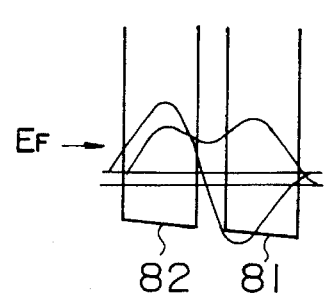
FIG. 24D

ELECTRON WAVE COMBINING/BRANCHING DEVICES AND QUANTUM INTERFERENCE DEVICES

This application is a continuation of application Ser. No. 07/739,258 filed Aug. 1, 1991, now abandoned.

BACKGROUND OF THE INVENTION

1. Field of the Invention

The present invention relates to a device for combining electron waves traveling along a plurality of waveguides into a single electron wave or inversely for branching an electron wave traveling along a waveguide into a plurality of electron waves using field-induced decoupling. Quantum interference devices utilize such combining and/or branching devices in which interference currents can be effectively modulated by external perturbations such as a magnetic flux, an electrostatic potential, or virtual transitions due to optical fields.

2. Related Background Art

There has been developed such quantum interference devices as shown in FIG. 1. Such a device includes structures for combining electron waves and/or branching the electron wave. In this device, the left half is an electron wave branching part and a right half is a combining part. The electron wave is input from an electrode 201 and propagates as a single electron wave in a part where the distance between two electron wave channels 202 and 203, having the same structure, is short enough to cause the coupling of electron waves. The electron wave then reaches a decoupling or branching part. In this branching part, the distance between the channels 202 and 203 is made larger than that in the upstream coupling part, so that a single electron wave is branched into two therein. These coupling and decoupling are in fact realized by changing the thickness of a barrier layer 204 comprising an AlAs layer.

Two branched electron waves then arrive at a combining part on the right side, are coupled into a single electron wave again and proceed as this single electron wave to finally each an electrode 205. A magnetic field H is applied to the decoupling part, having a direction as shown in FIG. 1. Therefore, when the magnetic field H is applied having such a magnitude as to cause a phase difference of an integer multiple of $\pi$ between the electron waves that respectively proceed along the upper and lower channels 202 and 203, the two electron waves which interfere with each other in the right-side combining part will all be reflected and therefore could not reach the electrode 205. When the applied magnetic field H has such a magnitude as to cause the phase difference of an integer multiple of $2\pi$, the interfered electron waves can pass through the right-side combining part and an output current having the same magnitude as the input current can be obtained from the electrode 205. Thus, in this device the current is controlled by modulating the applied magnetic field H. This is due to the magnetostatic Aharonov-Bohm (AB) effect. This current can also be controlled by modulating an electric field applied normal to the plane of channels 202 and 203, due to the electrostatic AB effect. In light of the structures of the channels 202 and 203, they are fabricated in such a fashion that the above phase difference can be caused by the AB effect.

As regards the length between the branching and combining parts in FIG. 1 (i.e., the length during which the decoupling is maintained), this should be less than 1 μm at temperatures of liquid helium under the present-day technology, since the coherence of electron waves should be maintained over that length.

The above device is the AB-effect type electron wave interference device, but there are some other types such as a resonant tunneling type, and an electron wave directional coupler type. FIG. 2 shows an electron wave interference device of the directional coupler type in which two electron wave channels 211 and 212 are fabricated on a semiconductor surface by etching, etc. In the channels 211 and 212, they are connected to each other at a central part or coupling part 213 and are separated and independent from each other at port parts 215, 216, 217 and 218. An electrode 219 is formed near the coupling part 213 to control the degree of coupling between two channels 211 and 212. In this connection, it should be noted that the coupling of electron waves should be distinguished from the coupling of channels or waveguides. For instance, the electron wave may be decoupled in the coupled channels.

In the prior art device of FIG. 2, the modulation in the degree of coupling is performed by controlling the electrostatic potential or voltage applied to the electrode 219 to vary the height of potential barrier between the two channels 211 and 212. This modulation in the degree of coupling in turn varies the coupling length between the channels 211 and 212 and the propagating electron wave will be switched between the port parts 215–218.

However, those prior art devices have the following drawbacks.

First, in the structure of FIG. 1, it is hard to fabricate slope portions of the barrier layer 204 in the branching and combining parts so that phases of the electron waves may not be confused. It is difficult to fabricate an extremely flat electron wave waveguide (fluctuations of thickness are below 1 atomic layer). Moreover, it is difficult to fabricate the slope portions because very high-precision device fabrication technology is needed. In particular, in order to form the structure of FIG. 1, layers to the AlAs barrier layer 204 between the two channels 202 and 203 are to be grown by the molecular beam epitaxy (MBE) process or metal organic-chemical vapor deposition (MO-CVD) process. It is then necessary to take out the wafer in the air and conduct the etching to form thick and thin portions in the barrier layer 204. But, at this time oxidization and impurity absorption at the surface of wafer will be inevitable. Therefore, the channel 203, such as GaAs quantum well, which is to be grown on this surface of wafer, would have a dilapidated hetero-boundary. This surface would then contain many impurities and defects. As a result, electrons which travel through that channel would be scattered and its phase would be disturbed, resulting in the degradation of the on/off or modulation ratio and detection performance in the interference current.

Further, in the structure of such device, the response of the device then depends on the RC time constant which effects the modulation of magnetic field, etc., so that very high speed response rapidity cannot be obtained.

Next, in the device of FIG. 2, provided that the wavelength of electron waves is several hundred Å and the coherence length of electrons is several μm (this assumption is reasonable), it is needed to set the widths of the channels 211 and 212, the length of the coupling part 213 and the width of the electrode 219 to about 100 Å, 1 μm and several tens Å, respectively. But, these values are unfeasible or impractical under the present-day device fabrication technologies.

Further, the electron wave channels 211 and 212 are curved, as a result of which the electron waves would be scattered and its phase would be disturbed. Thus, the performance of such prior art interference device would be degraded.

SUMMARY OF THE INVENTION

An object of the present invention is to provide an electron wave branching and/or combining device which uses field-induced decoupling of the electron wave, for example, in double quantum well structures.

Another object of the present invention is to provide a quantum interference device, including field-effect transistors, photodetectors without photon absorption, quantum nondemolition photodetectors and the like, which involves the above electron wave branching and/or combining structures.

According to one aspect to the branching device of the present invention, the device comprises a plurality of quantum-structure waveguides, each of the waveguides having at least one quantum energy level. A means is provided for applying a voltage or electrostatic potential to the quantum-structure waveguides. The quantum energy levels are varied by controlling the applied voltage, so that higher and lower ones of the energy levels are below the Fermi level in order to branch the electron wave.

According to one aspect to the combining device of the present invention, the device comprises a plurality of quantum-structure waveguides, each of the waveguides having at least one quantum energy level. A means is provided for applying a voltage to the quantum-structure waveguides. The quantum energy levels are varied by controlling the applied voltage, so that a higher one of the energy levels is above the Fermi level while a lower one of the energy levels is below the Fermi level in order to combine the electron waves.

According to one aspect to the electron wave branching-combining device, the device comprises a plurality of linearly-formed quantum-structure waveguides, each of the waveguides having at least one quantum energy level. A means is provided for applying a forward bias to the waveguides to form a part at which an electron wave is branched into electron waves confined in the maveguides. Another means is provided for applying a reverse bias to the waveguides to form a part at which electron laves confined in the waveguides are combined into an electron wave.

According to one aspect to the quantum interference device, the device comprises a plurality of linearly-formed quantum-structure waveguides, each of the waveguides having at least one quantum energy level. A means is provided for applying a forward bias to the waveguides to form a part at which an electron wave is branched into electron waves confined in the waveguides. The applied bias is modulated to create a modulated phase difference between the branched electron waves due to the AB-effect, thereby modulating interference current of the electron waves downstream of the branched part.

According to another aspect to the quantum interference device of the present invention, the device comprises a plurality of linearly-formed quantum-structure waveguides, each of the waveguides having at least one quantum energy level. A means is provided for applying a constant forward bias to the waveguides to form a part at which an electron wave is branched into electron waves confined in the waveguides. Another means is provided for applying a magnetic flux to the waveguides. The applied magnetic flux is modulated to create a modulated phase difference between the branched electron waves due to the AB-effect, thereby modulating interference current of the electron waves downstream of the branched part.

According to still another aspect to the quantum interference device of the present invention, the device comprises a plurality of linearly-formed quantum-structure waveguides, each of the waveguides having at least one quantum energy level. A means is provided for applying a forward bias to the waveguides to form a part at which an electron wave is branched into electron waves confined in the waveguides. And means is provided for directing light to the branched part. The light is modulated to create a modulated phase difference between the branched electron waves, thereby modulating interference current of the electron waves downstream of the branched part.

According to still further aspect to the quantum interference device of the present invention, the device comprises a plurality of linearly-formed quantum-structure channels, each of the channels having at least one quantum energy level. A source electrode means injects electron waves into the channels. A drain electrode means receives the electron wave from the channels, and a gate electrode means applies an electric field or electrostatic potential to the channels. The gate electrode means is disposed between the source and drain electrode means so as to vary a degree of coupling between the channels under the gate electrode means.

These advantages and others will be more readily understood in connection with the following detailed description, claims and drawing.

BRIEF DESCRIPTION OF THE DRAWINGS

FIGS. 10A–10C are views illustrating the changes of first and second subbands and wave functions in the embodiment of FIG. 9.

FIGS. 21A–21d are views showing the structure of an embodiment of the quantum interference device of this invention and behaviors of wave functions.

FIGS. 24A–24D are views showing the structure of an embodiment of the quantum interference device of this invention and behaviors of wave functions.

DESCRIPTION OF THE PREFERRED EMBODIMENT

Figure 1:
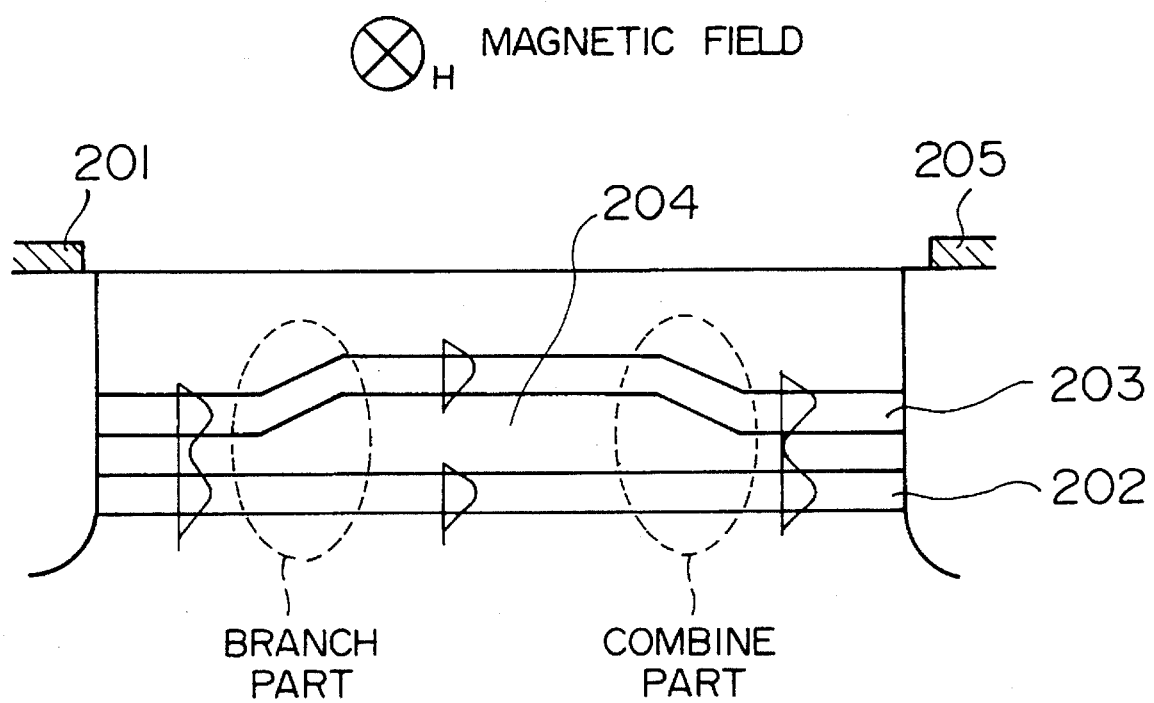
FIG. 1 is a cross-sectional view of a prior art quantum interference device.
Figure 2:
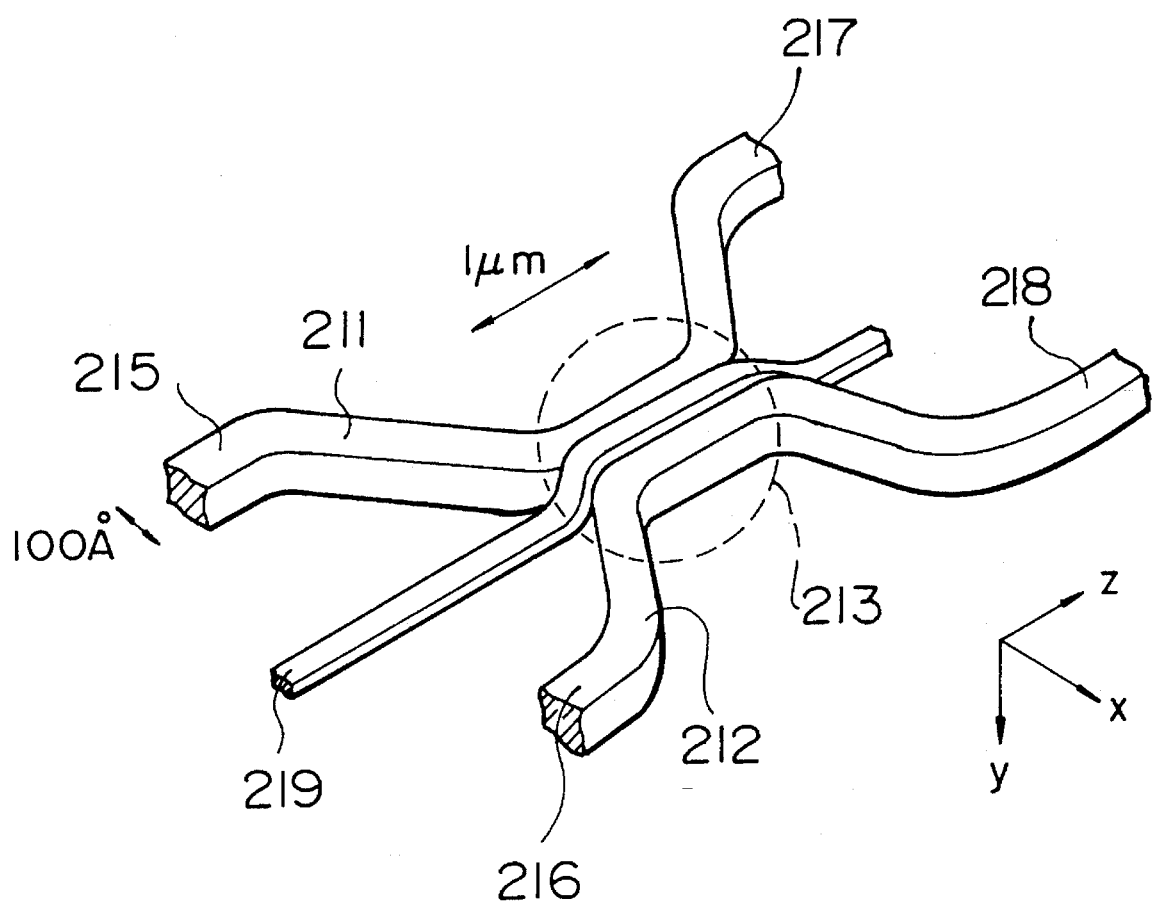
FIG. 2 is a perspective view of a prior art directional coupler type interference device.
Figure 3:
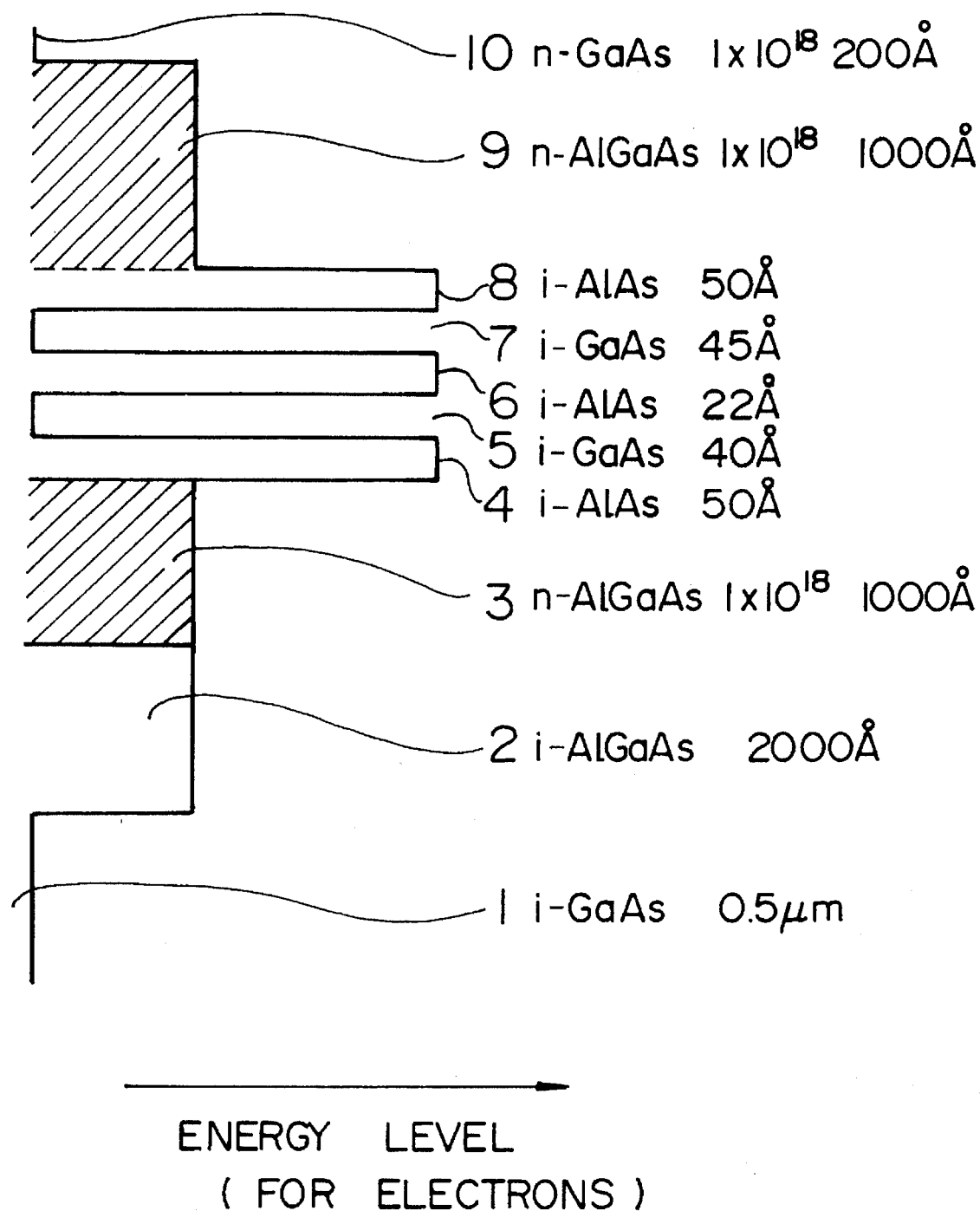
FIG. 3 illustrates the energy band structure of an embodiment of the electron wave combining device of this invention.

FIG. 3 shows the band structure of a conduction band in a first embodiment of the present invention of a wafer sample structure. In FIG. 3, the reference numeral 1 is an undoped (intrinsic) GaAs buffer layer which is utilized for improving the flatness of the instant wafer, reference numeral 2 is an undoped AlGaAs layer for forming a cladding layer of a waveguide, reference numeral 3 is an n-AlGaAs layer for supplying carriers to the waveguide, reference numeral 4 is an i (intrinsic)-AlAs layer which is a spacer layer for preventing the Coulomb scattering of propagating carriers owing to Si ions in the n-AlGaAs layer 3, reference numeral 5 is an i-GaAs layer which is a quantum well for forming the waveguide, reference numeral 6 is an i-AlAs layer sandwiched between GaAs well layers 5 and 7, which has such a thickness (e.g. 22 Å) as to realize the coupling between the wells 5 and 7, reference numeral 8 is an i-AlAs layer which is a spacer layer for preventing the Coulomb scattering of propagating carriers due to Si ions in an n-AlGaAs layer 9, and reference numeral 10 is an n-GaAs layer which is a top layer of the wafer for preventing the oxidization of AlAs layers 4, 6 and 8. In FIG. 3, the thicknesses and dopant concentrations are also illustrated. In this embodiment, the thickness (40 Å) of the lower well 5 is made smaller than that (45 Å) of the upper well 7 to realize an asymmetric double quantum well structure (ADQWS).

To increase the flatness of the well layers 5 and 7, a super-lattice buffer may be used as a buffer layer 1. In the above layer structure, in the case of a branching device, the dopant concentrations are set such that ground energy levels of the conduction band in the two quantum well layers 5 and 7 both are lower than the Fermi level, while in the case of a combining device, the dopant concentrations are set such that the ground energy level in one of the well layers 5 and 7 is lower than the Fermi level and that in the other well layer is higher than the Fermi level.

Figure 4:
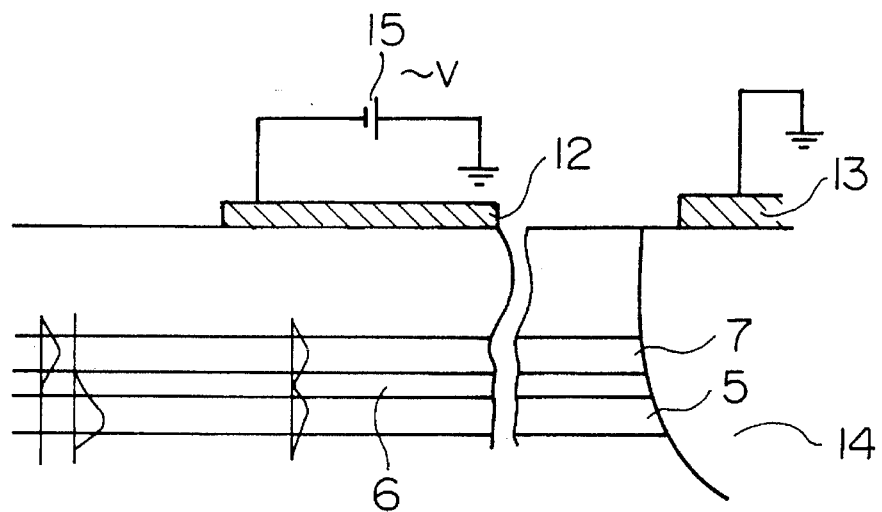
FIG. 4 is a view showing the structure of the embodiment of FIG. 3.
Figure 5:
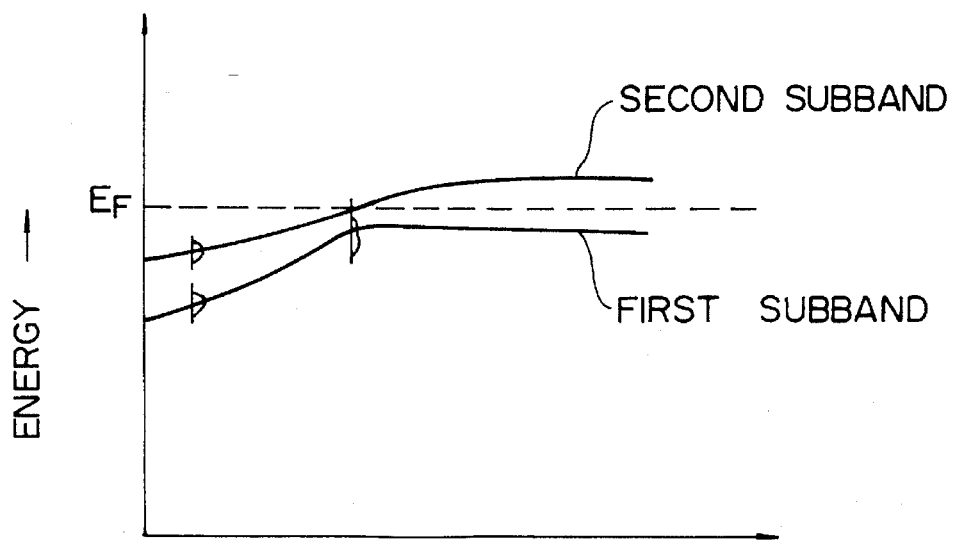
FIG. 5 illustrates the change of energy levels of first and second subbands in the electron wave propagating direction in the embodiment of FIG. 4.

FIG. 4 illustrates a cross-sectional view of a device for effecting combining which has the energy band structure as shown in FIG. 3. FIG. 5 illustrates the ground energy levels of the channels or waveguides 5 and 7 and wave functions thereof for explaining the operation principle of this embodiment. The well layers 5 and 7 are formed linearly even at the decoupling part, and in FIG. 4, reference numeral 12 is a gate electrode which is in Schottky contact with the top layer 10, reference numeral 13 is a drain electrode, reference numeral 14 is an AuGe diffusion portion for ohmic contact and reference numeral 15 is a power source. On a left side of this device, there is fabricated a means for branching a single electron wave from a source electrode (not shown) into two waves. Concerning this, please make reference to a structure which will be explained below with reference to FIG. 6.

By applying a voltage through the gate electrode 12, the energy levels of the quantum wells 5 and 7 are changed and the lowest two energy levels of the electron wave waveguides 5 and 7 (these will be called first and second subbands) vary as shown in FIG. 5 along the wave propagation direction, due to the coupling (level crossing) of levels in the two waveguides 5 and 7.

The operation is performed in the following manner. Both of the first and second subbands of the two waveguides 5 and 7 are below the Fermi level $E_F$ at the beginning portion in the propagation direction as shown in FIG. 5, so the electron wave begins to propagate with being separated in the two subbands at a certain ratio (preferably 1:1). Since the reverse bias voltage is applied through the gate electrode 12, the second subband will come to be above the Fermi level at a portion under the gate electrode 12. Therefore, electron waves will be combined at this portion and propagate solely in the first subband toward the right-side end.

Thus, in the first embodiment two waveguides 5 and 7 are fabricated in a parallel and linear manner to form a combining device. This is made possible because the coupling of levels or level crossing is performed by the control of the voltage applied through the gate electrode 12.

Figure 6:
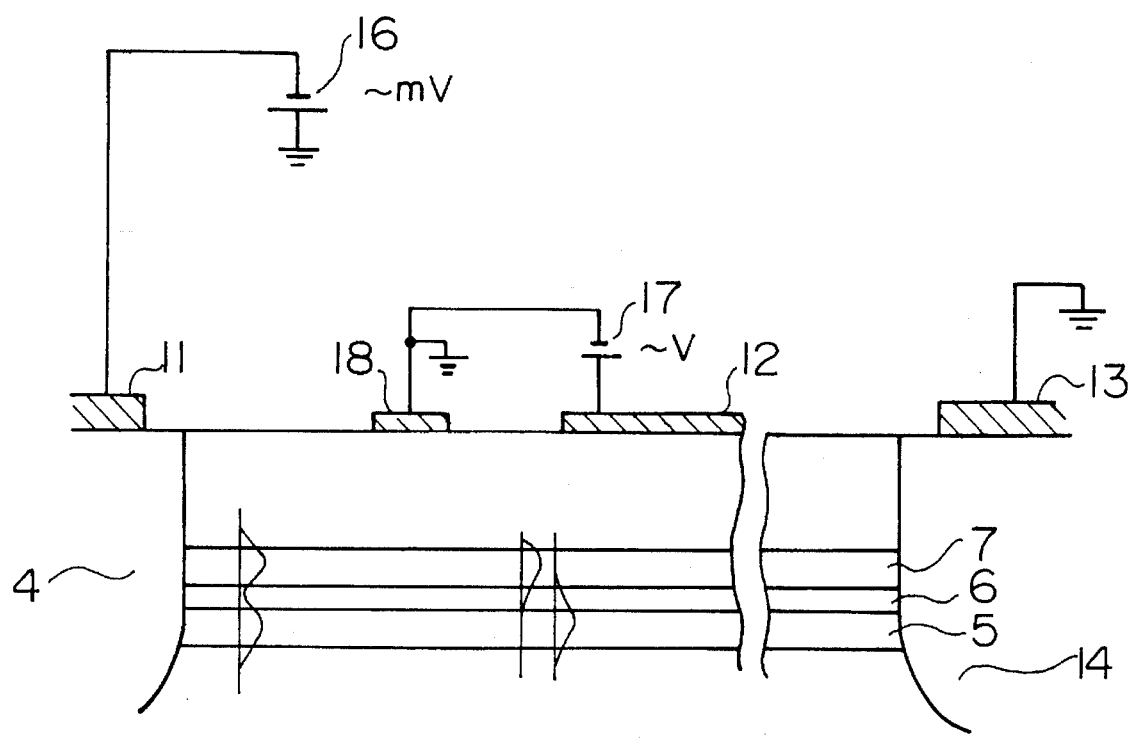
FIG. 6 is a view of another embodiment of the electron wave branching device of this invention.

FIG. 6 shows the second embodiment which is a branching device using the wafer sample structure having the energy band structure as shown in FIG. 3.

Figure 7:
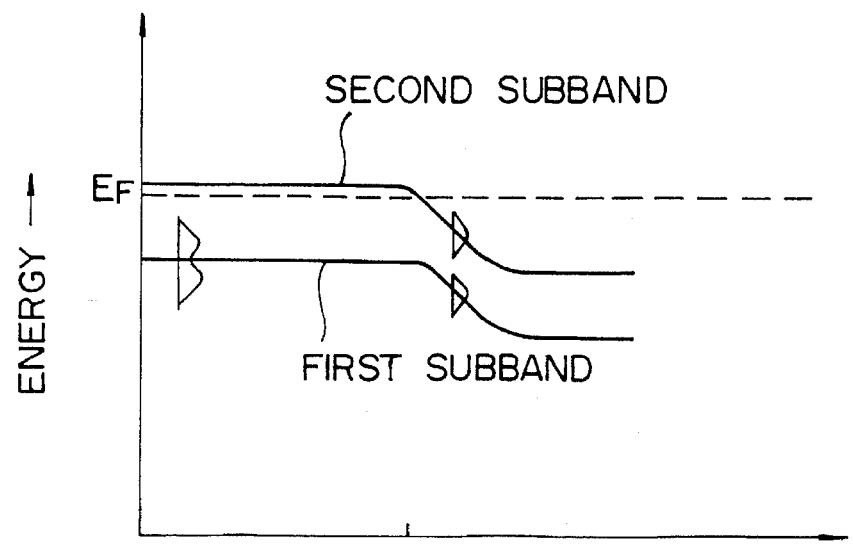
FIG. 7 illustrates the change of energy levels of first and second subbands in the electron wave propagating direction in the embodiment of FIG. 6.

In the second embodiment, it is necessary at the beginning electron waves should be coupled. The wells 5 and 7 have the same structure of a GaAs layer having the thickness of 40 Å and the barrier 6 is composed of an AlAs layer having the thickness of 15 Å. Regarding the energy level in the wells 5 and 7, the same energy levels are coupled. If the Fermi level is set as shown in FIG. 7, at the beginning the electron wave supplied from a source electrode 11 exists solely in the first subband (lowest coupled energy level) and propagates therethrough.

Figure 8:
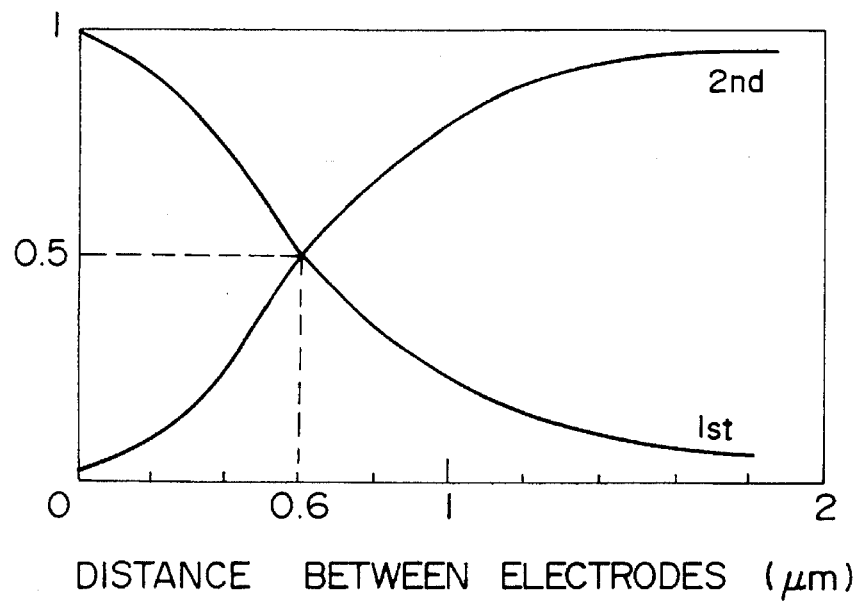
FIG. 8 illustrates the relationship between the branching probability or ratio and the distance between the electrodes.

As the electron wave reaches a part between a gate electrode 18 and the electrode 12 where the potential is sharply varied by the gate pair 12 and 18, the electron wave is branched into two which are respectively in the first and second subbands at an equal ratio and thus decoupled waves propagate through the waveguides 5 and 7, respectively. The potential is supplied to gate pairs 12 and 18 by a voltage source 17. This is because both the first and second subbands are, at that part, below the Fermi level as shown in FIG. 7. Here, where the distance between the gate pair 18 and 12 is set to about 500 Å, the electric field of 100 kV/cm is applied. The condition for sharing the electron wave between the waveguides 5 and 7 in an equal ratio (1:1 branching ratio) is that, as shown in FIG. 8, the distance between the gate pair 18 and 12 should be set to about 0.6 μm and the voltage of 100 kV/cm should be applied. In FIG. 3, it is assumed that thicknesses of the waveguides 5 and 7 are 40 Å and 45 Å, respectively, but in the second embodiment the waveguides 5 and 7 have the above stated symmetric DQWS, so that the figures are a little different from FIG. 3 as mentioned above (i.e., 500 Å and 100 kV/cm).

Thus, although the waveguides 5 and 7 are formed in a parallel and flat (or straight) form in the second embodiment, the decoupling of electron wave can be caused by controlling the gate voltage, and thus a combining device can be constructed easily.

Figure 9:
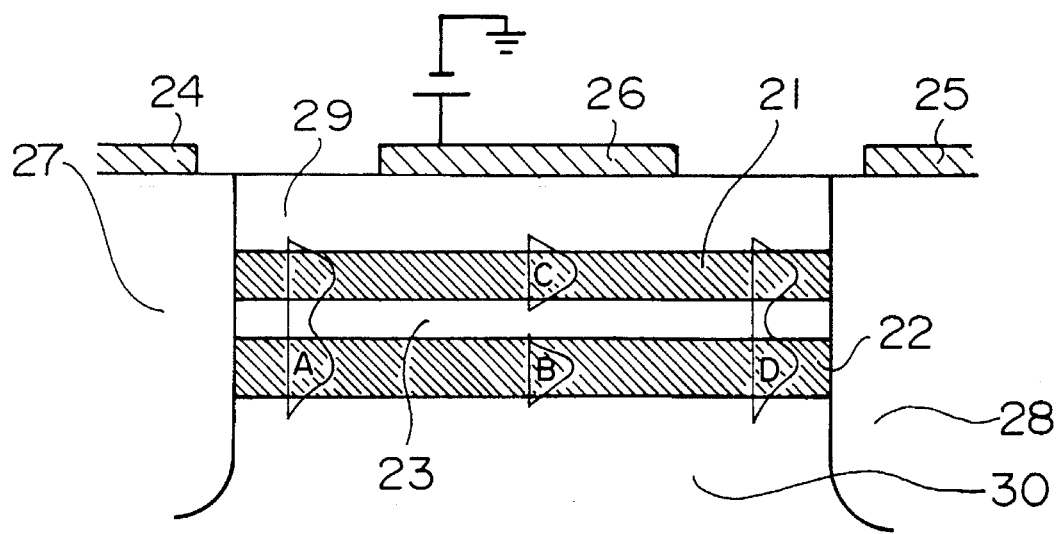
FIG. 9 is a view showing the structure of an embodiment of the quantum interference device of this invention.

FIG. 9 shows an embodiment of a quantum interference device including the above combining and branching structure. In FIG. 9, electron wave waveguides are composed of a GaAs well 21 and AlGaAs well 22, and the thickness and composition thereof are determined such that ground energy levels in the conduction band of the wells 21 and 22 are coupled as shown in FIG. 10A. Further, in FIG. 9, reference numeral 23 is an undoped (i-)AlAs barrier layer, reference numerals 24 and 25 are respectively source and drain electrodes composed of AuGe/Au and having ohmic contact, reference numeral 26 is a gate electrode formed between the electrodes 24 and 25 and having a length of about 1 μm and Schottky contact, reference numerals 27 and 28 are respectively AuGe diffusion portions for achieving the ohmic contact, reference numeral 29 is an n-AlGaAs layer into which n-type impurity such as Si is doped at about $10^{18}/cm^3$ concentration, and reference numeral 30 designates a layer structure composed of a spacer layer explained below, an AlGaAs layer into which Si of about $10^{18}/cm^3$ concentration is doped, and an undoped AlGaAs layer. In the above structure, there is formed between the quantum well 21 and the layer 29 an i-AlAs layer (not shown, the thickness of about 100 Å) which is a spacer layer for inhibitting the Coulomb scattering of propagating carriers.

Curves A, B, C and D in FIG. 9 indicate wave functions of electron waves that exist below the Fermi energy at respective locations.

FIGS. 10A–C illustrate the change of the energy levels when the forward bias is applied to the waveguides 21 and 22 through the gate electrode 26. Here, the quantum wells 21 and 22 (GaAs layer having a thickness of 40 Å separated by the AlAs barrier 23 of 15 Å thickness) are coupled, and when no voltage is applied, only the first subband out of the coupled levels is below the Fermi level $E_F$. When at least a predetermined voltage (forward bias) is applied through the gate electrode 26, the coupled mode is split and the two split modes are brought below the Fermi level $E_F$ (see the band structure in FIG. 10B). This condition is met by applying the electric field of 100 kV/cm, where the distance between the gate 26 and the source 24 is set to 500 Å.

Thus, at the beginning of propagation the electron wave propagates only in the first subband (lowest level) out of the coupled levels in the quantum wells 21 and 22, and the electron wave starts to travel as a single wave (see the wave A in FIG. 9). Next, in a part under the gate electrode 26, both of the first and second subbands of the wells 21 and 22 are below the Fermi level, so that electron wave is branched and propagates through both of the waveguides 21 and 22 (see waves B and C in FIG. 9). As the electron waves reach the right-side part, the electron waves are combined and propagate only in the first subband (see the wave D in FIG. 9).

The operation of this embodiment will be explained. Electrons supplied from the source 24 propagate through the coupled part of the waveguides 21 and 22 and reach the decoupled part to which the voltage is applied by the gate 26. Here, the phase difference between two electron waves is varied by modulating the applied voltage. Namely, in this case, the applied voltage acts to bring forth the phase difference as well as the decoupling function.

After passing that decoupled part, the electron wave propagates again through the coupled part and reaches the drain 25. However, such electron waves whose phase difference is π+2n π in the downstream coupled part could not reach the drain 5, as its energy is above the Fermi energy. On the other hand, where that phase difference is 2nπ, the electron wave can reach the drain 25.

Figure 11:
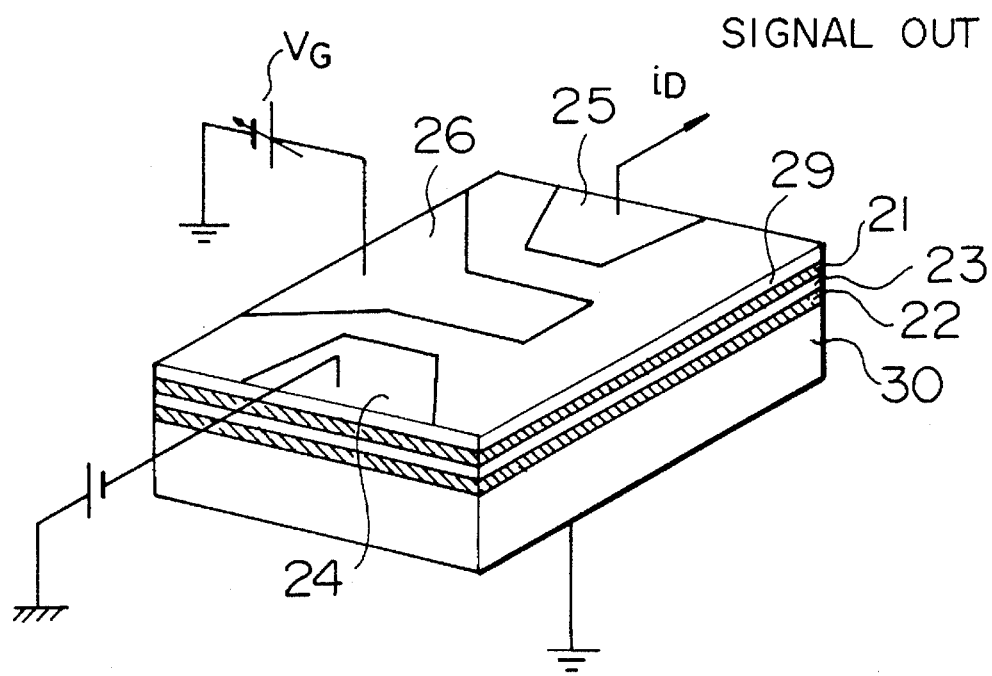
FIG. 11 is a perspective view showing the structure of the embodiment of FIG. 9.
Figure 12:
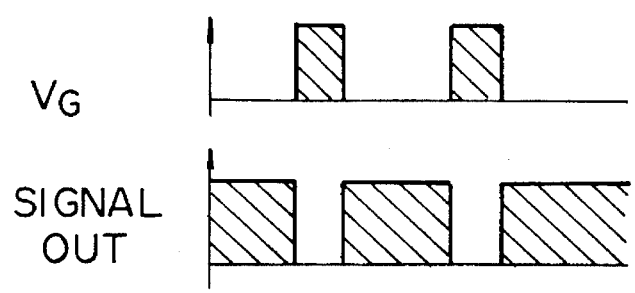
FIG. 12 is a representation illustrating the relationship between the gate voltage $V_G$ and signal.

FIG. 11 shows a device for controlling the interference current by modulating the gate electric field mentioned above. In this case, the gate voltage $V_G$ is 100%—modulated and the signal (interference current) is varied as shown in FIG. 12 in response to the modulation of $V_G$. In this device, a structure 32 is formed for confinement in a transverse direction, and the current signal is reduced to zero when the voltage is applied through the gate 26.

Figure 13:
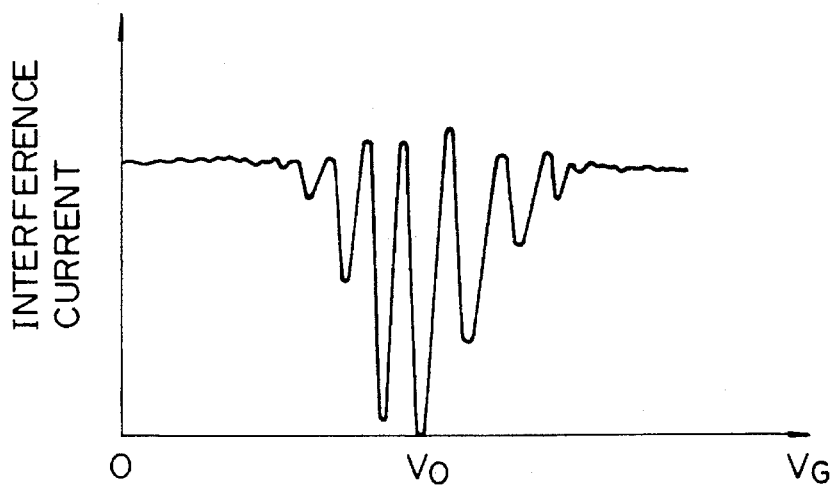
FIG. 13 is a representation showing the relationship between the gate voltage $V_G$ and interference current.

The phase difference between two electron waves is caused due to the electrostatic AB-effect, and the relationship between the gate voltage $V_G$ and interference current is as shown in FIG. 13, in this structure.

In the embodiment of FIG. 11, the interference current (signal) is switched between ON and OFF by switching the voltage $V_G$ between $V_o$ and 0 (zero). But, as is seen from FIG. 13, the current could be switched on and off by slightly modulating the gate voltage $V_G$ about $V_o$.

Figure 14:
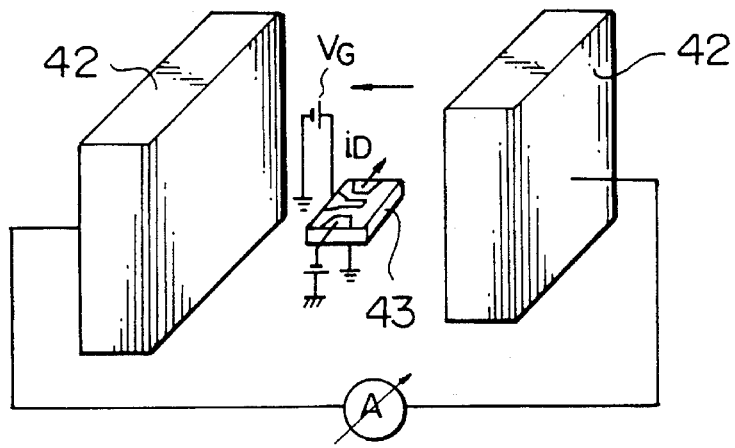
FIG. 14 is a perspective view showing the structure of an embodiment of the quantum interference device of this invention.

FIG. 14 shows an embodiment in which the gate voltage $V_G$ is kept unchanged and the magnetic field is modulated to modulate the interference current.

In this case, the phase difference between the two electron waves B and C (see FIG. 9) is controlled by applying the magnetic field across the layers 21, 22 and 23 of a device 43 in a direction of an arrow in FIG. 14. This phase difference θ is represented by $$\theta = 2\pi e/ch \cdot \Phi$$

where Φ is a magnetic flux passing through a portion of the layers 21–23 where the electron wave is branched into two, e is the charge of an electron, c is the velocity of light and h is Planck constant.

Figure 15:
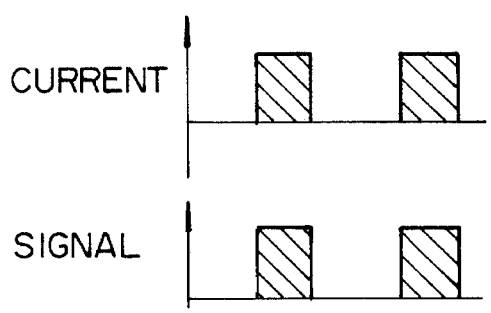
FIG. 15 is a representation illustrating the relationship between the interference current and signal.

The interference current is switched between ON and OFF, depending on whether the phase difference θ is an even number multiple of π or an odd number multiple of π. As illustrated in FIG. 13, the gate volt age $V_G$ is set to a constant $V_o$ and the magnetic field is modulated so that the relationship of FIG. 13 may be slightly shifted in a direction of the abscissa to modulate the interference current. Namely, as shown in FIG. 15, the signal current is switched to ON when the current flowing through electromagnets 42 is ON.

Figure 16:
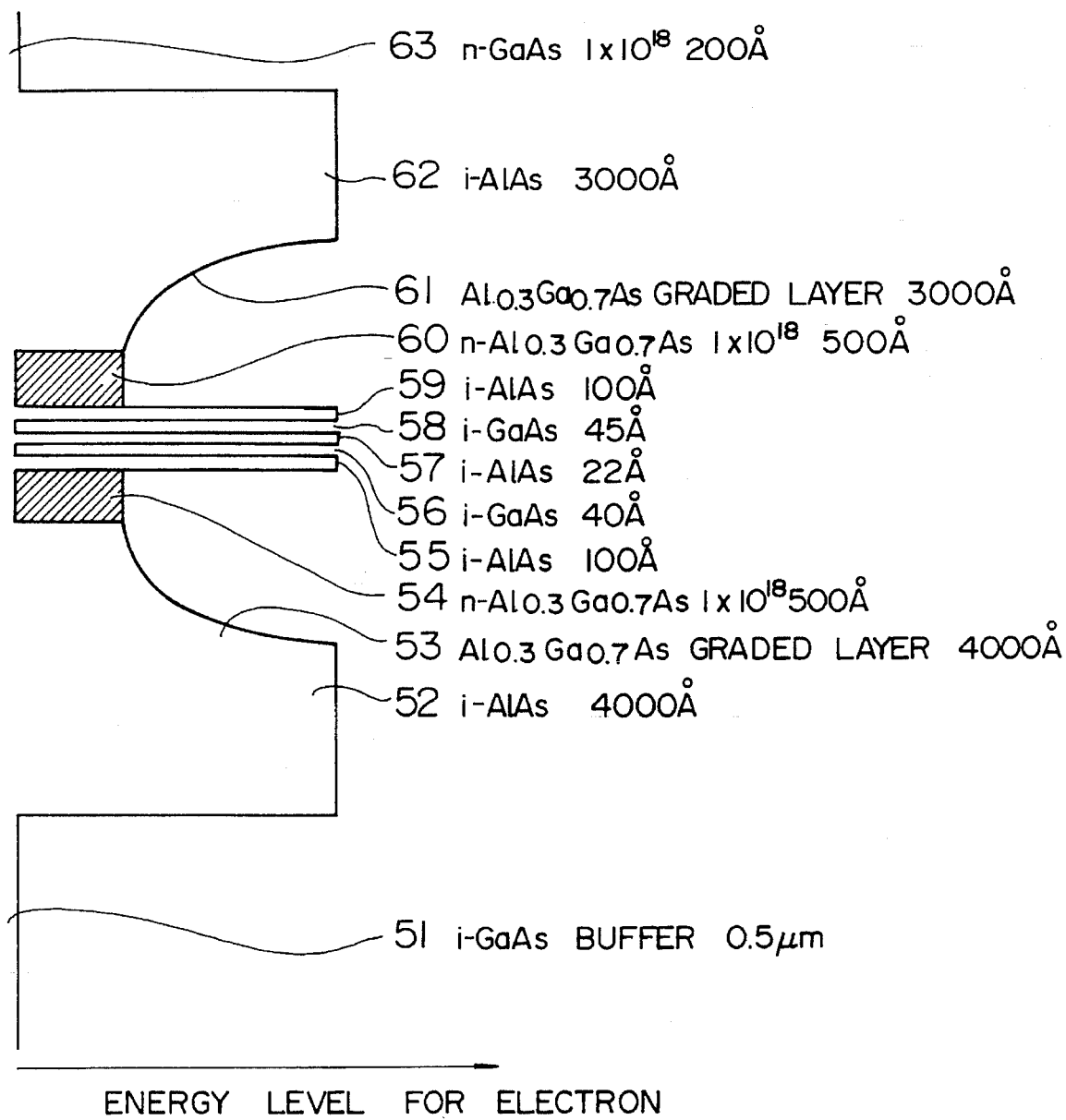
FIG. 16 illustrates the energy band structure of an embodiment of the quantum interference device of this invention.

FIG. 16 shows the band structure of a conduction band in the wafer sample structure of another embodiment of the quantum interference device of this invention.

In FIG. 16, reference numeral 51 is an undoped GaAs buffer layer for improving the flatness of the wafer, reference numeral 52 is an undoped AlAs layer for forming a cladding layer of a waveguide, reference numeral 53 is a graded layer (the Al content is changed from 1 to 0.3) in an AlGaAs core layer, reference numeral 54 is a Si-doped ($1 \times 10^{18}$/cm$^3$) $Al_{0.3}Ga_{0.7}As$ layer for supplying carriers to GaAs wells 56 and 58 in the AlGaAs core layer, reference numeral 55 is an i-AlAs layer which is a spacer layer for preventing the Coulomb scattering of propagating carriers due to Si ions in the AlGaAs layer 54, reference numeral 57 is an i-AlAs layer interposed between the GaAs wells 56 and 58 and having such a thickness (e.g., 22 Å) as to cause coupling between the wells 56 and 58, reference numeral 59 is a spacer layer similar to the spacer layer 55, reference numeral 60 is a Si-doped layer similar to the Si-doped layer 54, reference numeral 61 is a graded layer similar to the graded layer 53, reference numeral 62 is an i-AlAs layer similar to the i-AlAs layer 52, and reference numeral 63 is an n-GaAs layer which constitutes a top layer of the wafer for preventing the oxidization of the AlAs layer.

In the Si-doped layers 54 and 60, their doping concentrations are such that the lowest level (the first subband) of the quantum wells 56 and 58 is made below the Fermi level while the second subband level is made above the Fermi level. In FIG. 16, thicknesses and doping amounts of the respective layers are also shown.

In the structure of FIG. 16, a super-lattice buffer may be used for enhancing the flatness of the wells 56 and 58, instead of the graded layer 53. The quantum wells 56 and 58 constitute electron wave waveguides, respectively.

Figure 17:
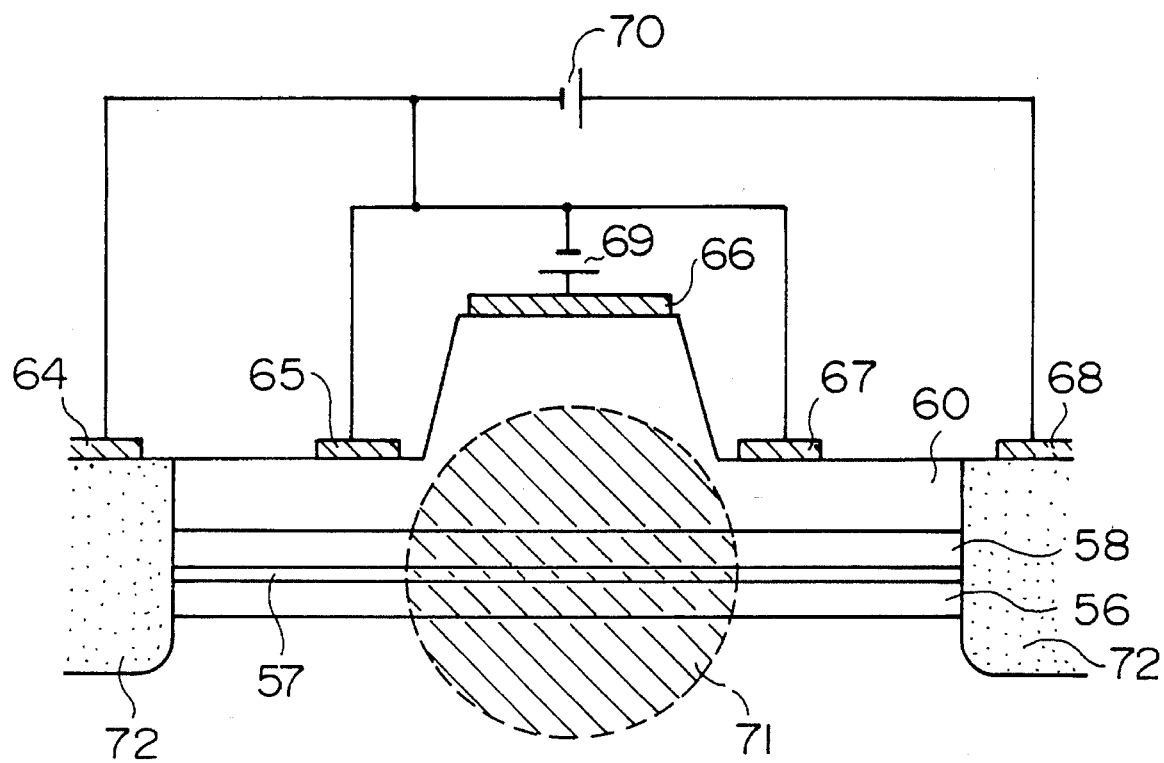
FIG. 17 is a view showing the structure of the embodiment of FIG. 16.
Figure 18:
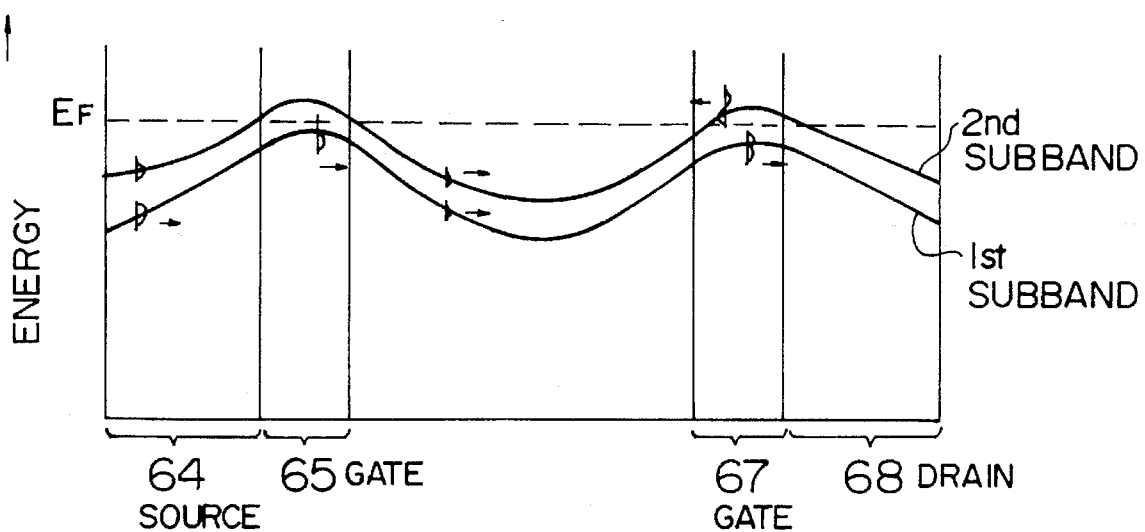
FIG. 18 illustrates the change of energy levels of first and second subbands in the electron wave propagating direction in the embodiment of FIG. 17.

FIG. 17 shows the structure of this embodiment having the energy band structure as shown in FIG. 16. FIG. 18 shows energy levels and wave functions of the electron wave waveguides 56 and 58 for explaining the operation principle of the embodiment of FIG. 17.

The well layers 56 and 58 are formed in a straight (flat) form both in coupling and decoupling parts, and in FIG. 17, reference numeral 64 is a source electrode, reference numerals 65 and 67 are gate electrodes having ohmic contact, reference numeral 66 is an electrode which acts to form the coupling and decoupling parts sharply as is shown in FIG. 18 and to branch a coherent electron wave created by the electrode 65 into two waves in the waveguides 56 and 58 at an equal ratio, reference numeral 68 is a drain electrode, reference numerals 69 and 70 are power sources, reference numeral 71 is a portion through which light (TM light) propagates, reference numeral 72 is an huge diffusion portion for achieving ohmic contact. By the voltage (minus or reverse) applied through the gate electrodes 65 and 67, the energy band structure of the i-layers is inclined to change the quantum energy levels in the wells 56 and 58, and the lowest two energy levels (first and second subbands) in the waveguides 56 and 58 are varied as shown in FIG. 18 due to the coupling or level crossing of the levels in the two electron wave waveguides 56 and 58.

In order to combine the electron wave in the coupling part under the gate electrode 65, the thickness of the barrier layer 57 is set to 22 Å, thicknesses of the well layers 56 and 58 are 40 Å and 45 Å, respectively, and the distance between the electrodes 65 and 66 is 0.6 μm.

The light waveguide 71 for propagation of TM light is fabricated by etching the layers 61, 62 and 63 of the wafer to form the ridge structure of about 1 μm width.

In FIG. 18 which illustrates the energy state and mode of the electron wave at locations along the propagation direction of electron wave in the waveguides 56 and 58, the dotted lines indicate the Fermi level $E_F$ and the two curved lines indicate two energy levels in the waveguides 56 and 58. Since the second subband comes to surpass the Fermi level $E_F$ under the gate electrodes 65 and 67, the electron wave is localized only in the first subband therefrom. Thus, the electron waves from the source 64 are coupled to the second subband between the gates 65 and 66 to be combined into one, and then branched into two at the 1:1 ratio to propagate in both the first and second subbands. Next, the 1:1 branched electron waves interfere with each other between the gates 66 and 67, and thereafter the electron wave travels in the second subband where the phase difference between the branched electron waves is $(2n+1)\pi$, while in the first subband where the phase difference thereof is $2n\pi$ (note n is an integer). Here, since the second subband is located above the Fermi level at the interfering position, the electron waves having the phase difference $(2n+1)\pi$ are all reflected not to reach the drain 68, while the electron waves of $2n\pi$ phase difference reach the drain 68 to the full.

The phase difference between the electron waves is controlled at a part between the gate 65 and the gate 67. As a control method, there is a method of modulating a magnetic field, etc., mentioned above, but in this embodiment, an optical Stark effect is utilized.

As to the optical Stark effect, in the atom and the like which have discrete energy levels, intervals between the levels are generally different, and if light applied to the atom which has photon energy not equal to the intervals but near thereto, the energy levels of electrons would shift. This is called the optical Stark effect. In the case of this embodiment, the discrete levels are energy levels Ea, Eb of the subbands of the well layers 56 and 58, and the optical Stark effect here rather should be called that due to virtual transitions between subbands.

Provided that such light is applied having the intensity ε of an electric field vector, levels of the respective subbands shift as follows:

$$Ea \rightarrow Ea - (e\mu\epsilon)^2/\delta$$

$$Eb \rightarrow Eb + (e\mu\epsilon)^2/\delta$$

where e is the charge of an electron, μ is the length of a dipole moment of the transition from the state of energy level Ea to the state of energy level Eb, and δ is a difference between the energy level interval and the photon energy (this is called a detuning energy).

In this embodiment, the shift amount of the subband quantum level is different between the wells 56 and 58 so that the phase difference may occur. For this purpose, since the photon energy is common to the two wells 56 and 58, the subband interval or μ only has to be made different between the wells 56 and 58. The simplest way is to make different the thicknesses of the well layers 56 and 58. In this embodiment, the light is propagated to the well layers 56 and 58, such light having photon energy that is larger than the inter-subband energy of one of the well layers 56 and 58 and is smaller than that of the other, leading to the virtual excitation. As a result, in the former well layer the lowest energy level approaches the Fermi level $E_F$ since the inter-subband energy becomes smaller and hence the lowest energy level is raised, while in the latter well layer the lowest energy level goes away from the Fermi level $E_F$ because the inter-subband energy becomes larger and hence the lowest energy level is lowered.

Figure 19:
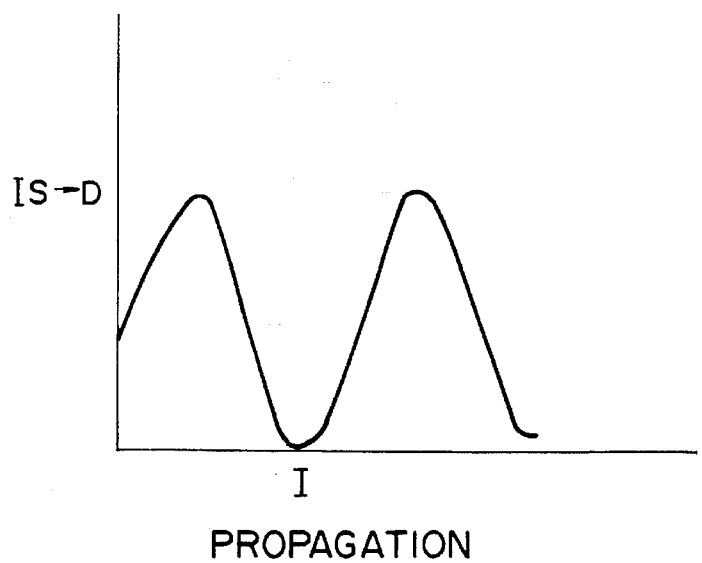
FIG. 19 is a representation illustrating the relationship between the light intensity and interference current.

Here, assuming that the energy shift amount is represented by $\Delta E$, the phase difference $\Delta \theta$ is given by $$\Delta\theta = m\Delta E/\hbar^2 \cdot (1/k + 1/k')l$$

where h is Planck constant, m is the mass of an electron, k and k' are wave number vectors of the electron waves and l is the distance between the gates 65 and 67. Since the energy shift amount $\Delta E$ is proportional to the intensity of light, the intensity I of the propagation light has the relationship with the current $I_s \rightarrow_D$ from the source 64 to the drain 68 as shown in FIG. 19. The initial phase can be made zero by modulating the voltages of the gates 65, 66 and 67 slightly.

Figure 20:
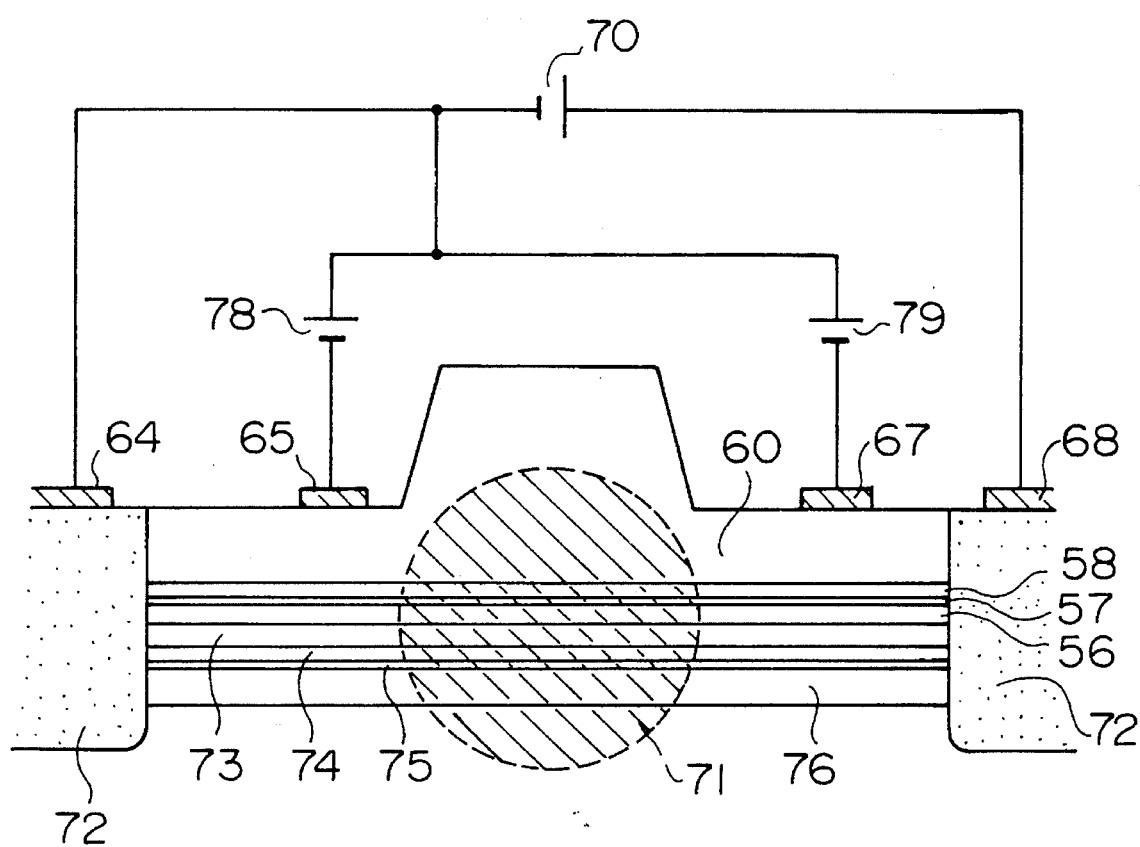
FIG. 20 is a view showing the structure of still another embodiment of the quantum interference device of this invention.

FIG. 20 shows still another embodiment of the quantum interference device of this invention. In this embodiment, there are disposed two pairs of electron wave waveguides 56, 58; 74, 76. For example, provided that the waveguides 56 and 74 sandwiching an AlAs layer 73 have the same structure, that the inter-subband energy of the well layer 58 is smaller than that of those well layers 56 and 74 and that the inter-subband energy of the well layer 76 is larger than that of those well layers 56 and 74, the wavelength range for driving this device will be extended about twice as much, except the wavelength (photon energy) which performs the real excitation of the waveguides 56 and 74. That is, such lights can be used as have wavelengths (photon energy) in a range between values one of which is a little larger than the inter-subband energy of the waveguides 56 and 74 and the other of which is a little smaller than the same, and such lights can modulate the current from the source 64 to the drain 68. Other structures are substantially the same as those of the embodiment of FIG. 17, except that in FIG. 20 the gate electrode 66 is omitted and power sources 78 and 79 are disposed for applying the negative voltage through the gate electrodes 65 and 67, respectively. The operation principle is basically the same as that of the embodiment of FIG. 17.

In this embodiment, virtual transitions between the subbands due to optical fields are utilized to produce the phase difference between the branched electron waves, so that ultra-high speed response of the order of sub-pico seconds is possible.

FIGS. 21A–21D show a further embodiment of the quantum interference device. This embodiment basically has a modulation-doped FET structure in which two quantum wells are utilized as an electron wave channel.

In FIG. 21A, two quantum wells consist of well layers of GaAs 81 (70 Å thickness) and GaAs 82 (50 Å thickness), respectively, and a barrier layer therebetween is composed of a $Ga_{0.7}Al_{0.3}As$ layer 83. In n-$Ga_{0.7}Al_{0.3}As$ layers 84 and 85 which are barriers above and below the well layers 81 and 82, respectively, portions thereof (100 Å thickness) contacting the well layers 81 and 82 are undoped and the other portions thereof are respectively modulation-doped by Si ($2 \times 10^{18} cm^{-3}$ concentration).

Source and drain electrode parts 86 and 87 are formed by thermal-diffusing the deposited AuGe/Au films. Between the source electrode 86 and the drain electrode 87, gate electrodes (gate 88a and back-gate 88b) are formed in such a manner that they sandwich the two well layers 81 and 82, and the back-gate 88b is interposed between a semi-insulate GaAs substrate 89 and the barrier layer 85.

The channels of the well layers 81 and 82 have such a structure as confines electrons in the y-direction. In the source and drain electrode parts 86 and 87, wave functions $\phi_1$ and $\phi_2$ respectively localized in the quantum wells 81 and 82 are independent from each other. Further, at these electrodes 86 and 87, the Fermi level $E_f$ is located between the first subband $E_1$ and the second subband $E_2$ as shown in FIGS. 21B and 21D. This is achieved by controlling the Fermi level with the doping amount in the source and drain electrode parts 86 and 87.

On the other hand, in the gate electrode, the voltage is applied between the gate 88a and the back-gate 88b, and this voltage is adjusted such that the levels $E_1$ and $E_2$ of the quantum wells 81 and 82 are generally equal to each other as shown in FIG. 21C.

Now, assuming that the voltage $V_{SD}$ (usually several mV) is applied between the source 86 and the drain 87, the electron wave is emitted from the source 86 toward the gate 88a and back-gate 88b, which takes the first subband level $E_1$ (coupled) and whose wave function $\phi_1$ is localized in the well of 70 Å thickness. At the gate part 88a and 88b, the quantum levels $E_1$ and $E_2$ in the wells 81 and 82 are about equal, so that the tunneling probability between the quantum wells 81 and 82 is increased. In this structure, the back-gate 88b is necessary for ensuring an appropriate application of the voltage across the two wells 81 and 82 (especially the lower well 82).

Figure 22:
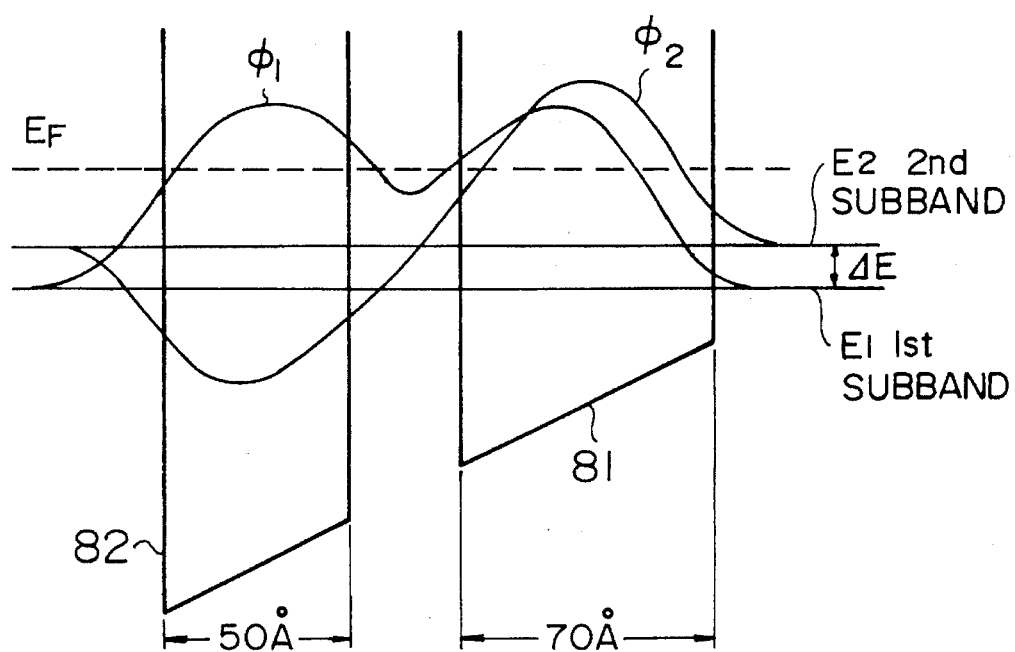
FIG. 22 is an enlarged view showing wave functions at the gate region in the embodiment of FIG. 21.

Thus, shapes of the wave functions at the gate part 88a and 88b are as shown in FIG. 22. The wave function $\phi_1$ in the first subband $E_1$ has a shape like an even function, and the wave function $\phi_2$ in the second subband $E_2$ has a shape like an odd function. Further, the levels $E_1$ and $E_2$ have an energy difference $\Delta E$ which depends on the coupling strength between the wells 81 and 82. The difference $\Delta E$ can be adjusted by varying the energy height of the barrier 83 between the wells 81 and 82 and the thickness thereof. In this embodiment, the barrier consists of $Al_{0.3}Ga_{0.7}As$ of 35 Å thickness.

Provided that the Fermi level at the gate part 88a and 88b is $E_F$, that the energies of the first and second subbands are $E_1$ and $E_2$, respectively, and that electrons have no kinetic energy in the y-direction in FIG. 21, wave numbers of the first and second subbands in the z-direction are given by $$K_{z1} = 1/\hbar \cdot \{2m^*(E_F - E_1)\}^{1/2}$$

$$K_{z2} = 1/\hbar \cdot \{2m^*(E_F - E_2)\}^{1/2}$$

where m* is the effective mass of an electron, $\hbar = h/2\pi$ and h is Planck constant.

Here, existence probabilities of electrons in the quantum wells 81 and 82 are approximately represented by $$|\phi(x,z)|^2 = 1/2 \cdot |\phi_1(x)e^{ik1z} + \phi_2(x)e^{ik2z}|^2$$

where $\phi_1(x)$ and $\phi_2(x)$ are wave functions of the first and second subbands, respectively.

As is seen from this equation, when $e^{ik1z}$ is equal to $e^{ik2z}$, yielding $$|\phi(x,z)|^2 = 1/2 \cdot |\phi_1 + \phi_2|^2$$

Namely, as is known from FIG. 22, the existence probability of electrons is high in the well 81 of 70 Å thickness where two wave functions are positive.

On the other hand, where $e^{ik1z} = -e^{ik2z}$ or one of the phases is inverse to the other, yielding $$|\phi(x,z)|^2 = 1/2 \cdot |\phi_1 - \phi_2|^2$$

and almost all the wave functions are localized in the well 82 of 50 Å thickness.

Thus, electron waves pass through the gate region 88a and 88b being alternately localized in the well 82 having a thickness of 50 Å and the well 81 having a thickness of 70 Å, and thereafter the wells 81 and 82 become decoupled since the applied voltage becomes small. Thus, the electron wave (coupled electron waves) is belonged solely to the first subband $E_1$ where the wave function is localized in the well 81 having a thickness of 70 Å or to the second subband $E_2$ where the wave function is localized in the well 82 haing a thickness of 50 Å, depending on the length $L_G$ of the gate region and the coupling strength between the wells 81 and 82 (i.e., the difference between $k_1$ and $k_2$ determined by the configuration of the barrier 83 and the voltage between the gate 88a and the back-gate 88b).

In the drain electrode 87, electrons coupled to the second subband are all reflected since the second subband has the energy $E_2$ higher than the Fermi level (see FIG. 21A). According to such mechanism, the conductance between the source 86 and the drain 87 is modulated depending on the amount of electron wave reflected at the drain 87.

Figure 23:
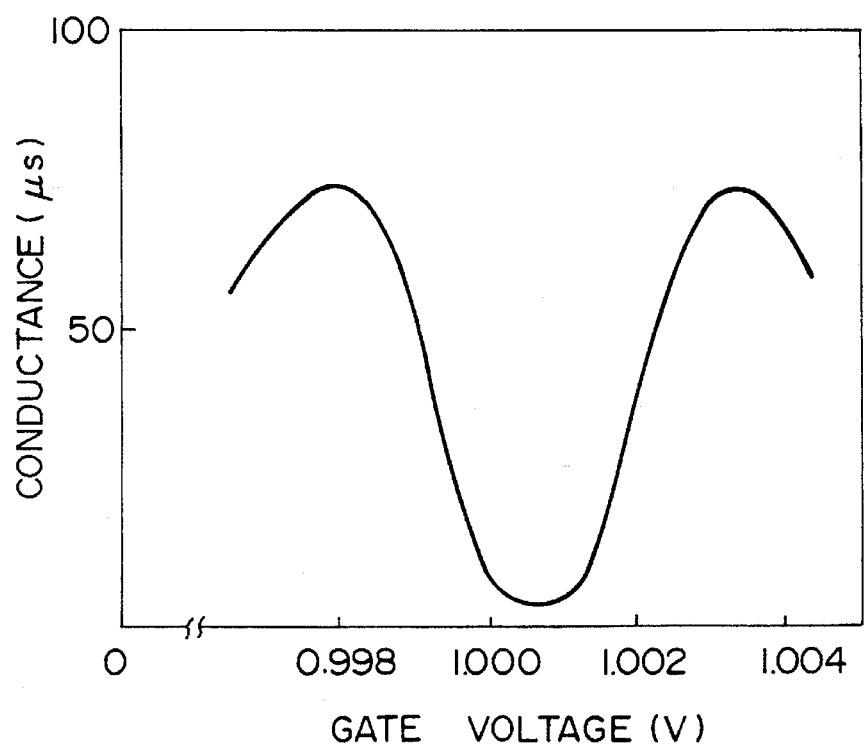
FIG. 23 is a representation indicating the relationship between the gate voltage and the conductance in the embodiment of FIG. 21.

FIG. 23 illustrates the manner of change in the conductance between the source 86 and the drain 87 in response to the gate voltage ($V_{DBG}-V_{DG}$). As is seen from FIG. 23, the conductance can be greatly varied merely by changing the voltage between the gate 88a and the back-gate 88b only several mV.

FIGS. 24A–D show a still further embodiment of the quantum interference device of this invention. This embodiment differs from the embodiment of FIG. 21A in that the filtering of electron waves (i.e., emitting the coupled electron wave only into the first subband $E_1$ or propagating only the coupled electron wave in the first subband into the drain 87) is performed not by the source electrode 86 and the drain electrode 87, but by locating the Fermi level $E_F$ between the first subband $E_1$ and the second subband $E_2$ by the reverse bias through sub-gates 95a and 95b, as shown in FIG. 24B.

Further, there are provided two gates 96a and 96b for slightly modulating the degree of coupling between the quantum wells 81 and 82. By these gates 96a and 96b, such biases are applied which are respectively forwardly and reversely deviated from such voltage which achieves the equality of the two levels in the quantum wells. This is shown in FIGS. 24B and C. As a result, in this embodiment, the coupled electron wave can propagate solely in the lowest energy level in which the wave function is localized in one well which is the upper well 81 nearer to the gate.

Thus, in this embodiment, since the sub-gates 95a and 95b as well as the source 86 and the drain 87 are formed, the Fermi level is adjusted by the reverse bias voltages applied by the sub-gates 95a and 95b, not by the doping in the source 86 and the drain 87 as in the embodiment of FIG. 21A. Therefore, the Fermi level $E_F$ can easily be located between the first and second subbands $E_1$ and $E_2$ by totally raising or lowering the energy level.

Advantages of the provision of the divided two gates 96a and 96b are as follows.

Figure 25:
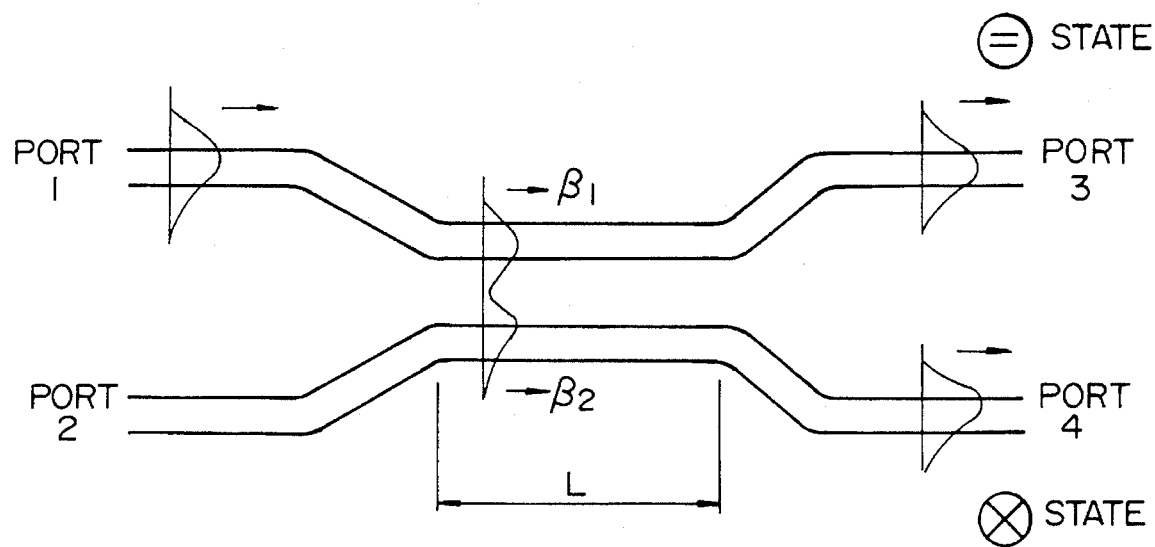
FIG. 25 is a view for explaining characteristics of a directional coupler type electron wave interference transistor.

In general, a directional coupler type electron wave interference transistor can be schematically represented as such a directional coupler as shown in FIG. 25, where $\beta_1$ and $\beta_2$ are wave numbers of electron waves in the z-direction in two electron wave channels prior to the coupling, and $\Delta\beta=\beta_1-\beta_2$.

Whether a state in which all the electron wave incident on a port 1 emits through a port 3 (indicated with a mark ⊖) or a state in which all the electron wave incident on the port 1 emits through a port 4 (indicated with a mark ⊗) is achieved, is determined by the amount of $\Delta\beta$, the length L of a coupling region and a coupling coefficient κ.

According to the solution of a coupled mode equation, the ⊗ state is achieved when $$\kappa L=(2v+1)\pi/2$$

$$\Delta\beta=0$$

where v is an integer. And the ⊖ state is achieved when $$\{L(\pi/2\kappa)\}^2+(\Delta\beta L/\pi)^2=(2v)^2$$

Therefore, in such a structure as shown in FIG. 21A, in order to effect the 100% switching of the interference current, the device should satisfy the conditions $\Delta\beta=0$ and $L=/2\kappa\cdot(2v+1)$. Here, $\Delta\beta=0$ can be achieved by slightly modulating the voltage applied to the device, but it is apparent that making the length L of the coupling region exactly equal to the above value cannot be attained, when the size of the device (L≈1 μm) is considered, This is the reason the conductance does not fall into an exact zero as shown in FIG. 23.

In contrast,, in the embodiment of FIG. 24A, the voltages applied by the gates 96a and 96b are adjusted such that $\Delta\beta$ is positive (or negative) in the region of the gate 96a while $\Delta\beta$ is negative (or positive) in the region of the gate 96b and that absolute values of both are equal to each other. That adjustment is possible in the structure of FIG. 24A.

From the coupled mode equation, the ⊗ state is obtained when $$\kappa^2/\{\kappa^2+(\Delta\beta/2)^2\}\cdot\sin^2[L/2\cdot\{\kappa^2+(\Delta\beta/2)^2\}^{1/2}]=\frac{1}{2}$$

From this equation, it is seen that the ⊗ state will surely be achieved in the structure as shown in FIG. 24 by adjusting $\Delta\beta$, only if L is made larger than $\pi/2\kappa$(complete coupling length). This size of the device can be realized easily.

The ⊖ state is achieved when $$\{L(\pi/2\kappa)\}^2+(\Delta\beta L/\pi)^2=(4v)^2$$

This state is also achieved without fail by adjusting a $\Delta\beta$. Thus, in the embodiment of FIGS. 24A–D, the 100% modulation of the quantum interference current can be achieved by varying the magnitude of a $\Delta\beta$.

Figure 26:
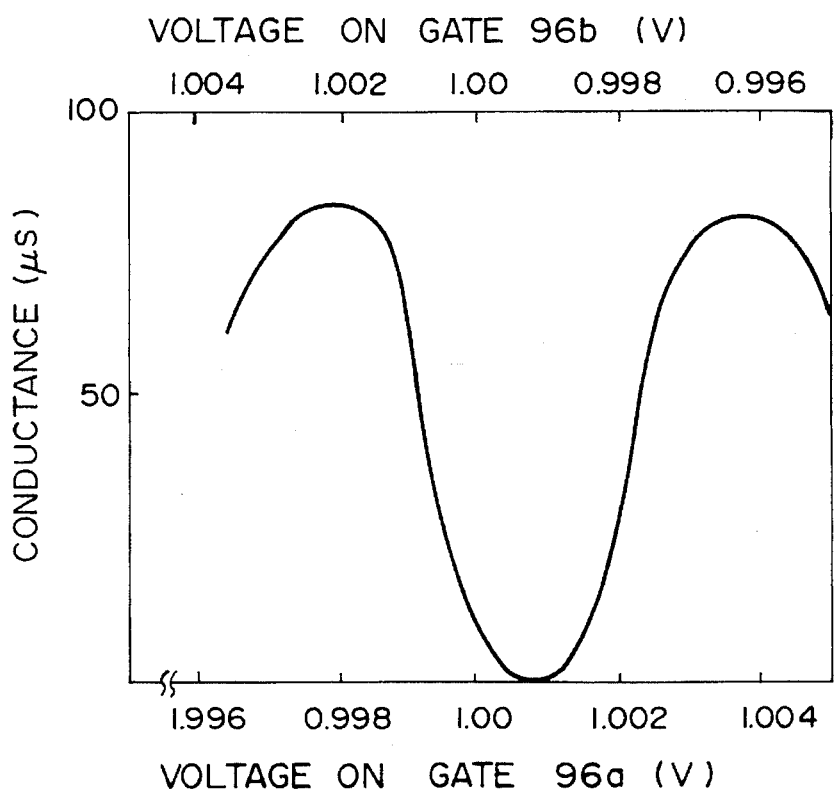
FIG. 26 is a representation indicating the relationship between the voltages of two gates and the conductance in the embodiment of FIG. 24.

FIG. 26 shows the relationship between the voltages applied by the gates 96a and 96b and the conductance between the source 86 and the drain 87. It is learned therefrom that the conductance can fall into a substantial zero in the embodiment of FIG. 26.

In this embodiment, since the directional coupler type electron wave channels are constructed by controlling the degree of coupling between the quantum wells using the electrostatic potential applied normal to the planes of the wells, such a quantum interference device is obtained which is excellent in the maintenance of coherence of electron waves and its fabrication and in which the source-drain current can greatly be varied by changing the gate voltage a little (about the order of mV).

In the above embodiments, GaAs and the like are used, but other materials such as III–V group, II–VI group (CdTe and the like) can also be used similarly.

Figure 27:
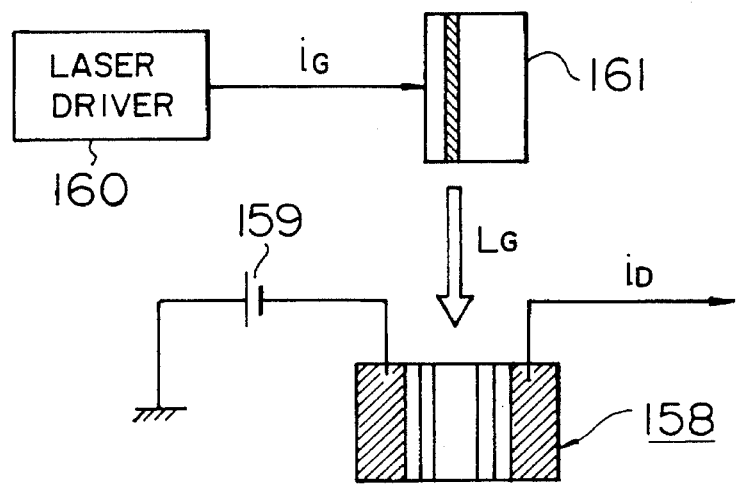
FIG. 27 is a block diagram showing an example in which the quantum interference device of this invention is used as an optical gate transistor.

The above quantum interference devices can be used as a high-speed current modulator, and, as an example, FIG. 27 shows a block diagram illustrating an optical gate transistor in which the embodiment of FIG. 17 or FIG. 20 is employed.

In FIG. 27, reference numeral 158 is such device, and between the electrodes of the device 158 the voltage is applied by a power source 159. To the device 158 a gate light $L_G$ is applied from a laser light source 161 such as a semiconductor laser. The drain current $i_D$ of the device 158 is modulated by modulating the light $L_G$ by a current $i_G$ is supplied to the light source 161 from a laser driver 160. When the gate light $L_G$ is a pulse light whose pulse width is below 1 ps, the drain current $i_D$ can be modulated at this rate.

Figure 28:
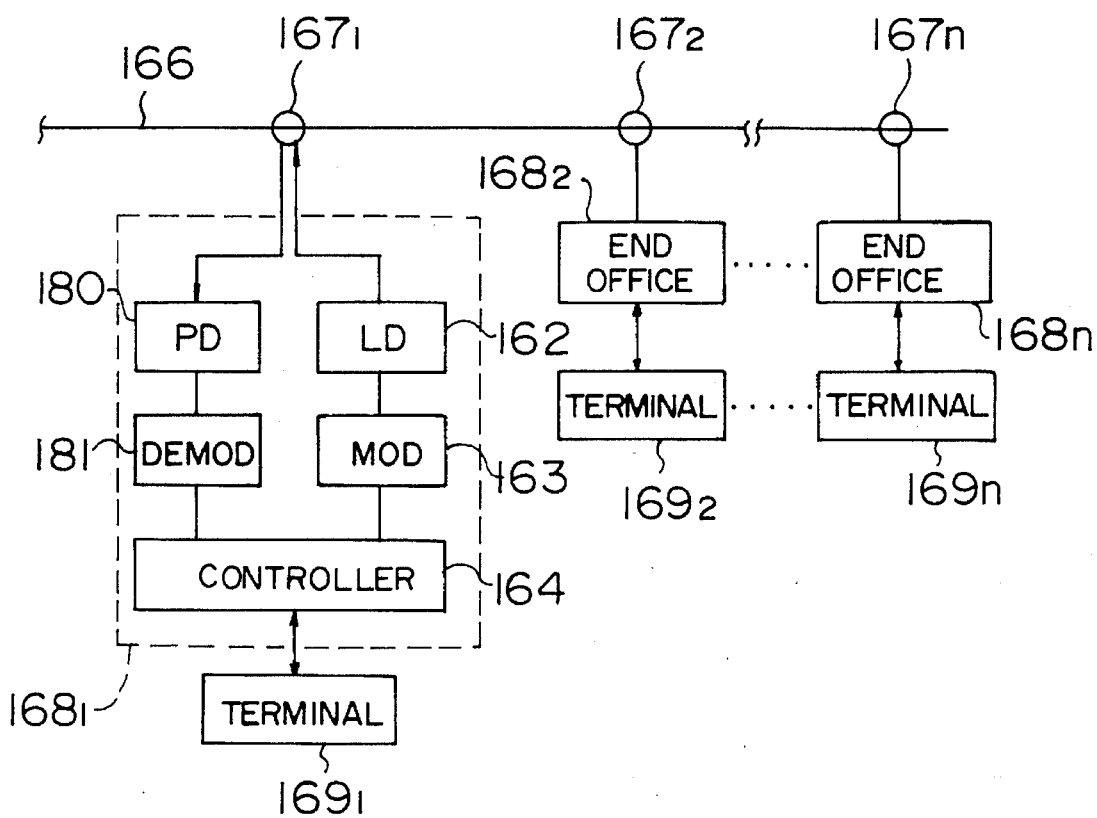
FIG. 28 is a block diagram showing an example of optical communication systems in which the quantum interference device of this invention is used as a photodetector.

FIG. 28 shows a block diagram illustrating an optical communication system in which the embodiment of FIG. 17 or FIG. 20 is used as a photodetector. In FIG. 28, reference numeral 166 is an optical fiber for transmitting light signals. A plurality of end offices $168_1, 168_2, \ldots, 168_n$ are connected to the fiber 166 through optical nodes $167_1, 167_2, \ldots 167_n$, respectively. To the respective end offices, are connected terminals $169_1, 169_2, \ldots, 169_n$ which include a keyboard, a display device, etc.

In each end office, there are provided a light signal transmitter consisting of a laser light source 162 and a modulator 163 and a light signal receiver consisting of a photodetector 180 and a demodulator 181. These transmitter and receiver are controlled by a controller 164 according to instructions from the terminal $169_1$.

As has been explained hitherto, novel electron wave combining and/or branching devices and Aharonov-Bohm type quantum interference devices are proposed by this invention, which have no curved electron waveguide structures to form an electron branching or decoupling part or ring geometry. But instead the electron branching part or ring geometry is effectively constructed in, for example, a straight double quantum well structure, by the control of the shapes of the wave functions or of the subband energy levels relative to the Fermi level by electric fields.

While there has been shown and described what are considered preferred embodiments of the present inventions, it will be obvious to those skilled in the art that various changes and modifications may be made therein without departing from the inventions as defined by the claims.

What is claimed is:

1. A quantum interference device comprising:

a semiconductor member having a source, a gate, and a drain, said source and drain comprising spaced regions of said semiconductor body, and said gate lying generally between the source and drain;

an electron waveguide structure extending between said source and said drain, said electron waveguide structure having a gate controlled channel portion immediately adjacent said gate and source and drain channel portions lying between said gate controlled channel portion and said source and drain, said electron waveguide structure comprising a pair of quantum confinement structures of a first semiconductor material each having a first dimension in a direction normal to the direction between said source and drain and being separated in said direction normal to the direction between said source and drain by a barrier layer having a second dimension in said direction normal to the direction between said source and drain, said barrier layer being made of a second semiconductor material having a lower affinity for electrons than said first semiconductor material, the difference in electron affinities between said first semiconductor material and said second semiconductor material and said first and second dimensions being such that, in said direction normal to the direction between said source and drain, energy levels for electrons in said electron waveguide structure are quantized into discrete energy levels, the lowest of said discrete energy levels having a quantum mechanical electron wave function which is generally symmetrical about said barrier layer in said direction normal to the direction between said source and drain, the next lowest of said discrete energy levels being generally antisymmetrical about said barrier layer in said direction normal to the direction between said source and said drain, so that said lowest energy level has a wavefunction which is coupled between said pair of quantum confinement structures, and so that said next lowest energy level has a wavefunction which, by reason of its generally antisymmetrical nature, has a value of zero within said barrier layer and antisymmetrical nodes in said pair of quantum confinement structures so that the wavefunction of said next lowest energy level is decoupled between said pair of quantum confinement structures;

said electron waveguide structure having a Fermi level for electrons;

said gate structure including an electrode; and means for applying a voltage to said electrode of said gate structure with respect to said source or said drain such that the energy of said next lowest energy level is shifted from an energy lying above the energy of said Fermi level to an energy lying below the energy of said Fermi level at the interface between said gate controlled channel portion and said source and drain channel portions, whereby electron waves in said electron waveguide structure are coupled between said pair of quantum confinement structures when said energy of said next lowest energy level is above the energy level of said Fermi level, and electron waves in said electron waveguide structure are decoupled between said pair of quantum confinement structures when said energy of said next lowest energy level is below the energy level of said Fermi level.

2. A quantum interference device according to claim 1, wherein, when the voltage applied to said gate electrode is varied, a phase difference is caused between the electron waves propagating through said first and second electron waveguides due to Aharonov-Bohm effect, so as to interfere with each other, whereby an electric current flowing between said source and said drain is modulated by the interference.

3. A quantum interference device according to claim 1, further comprising means for applying a magnetic field to said first and second electron waveguides, whereby an electric current flowing between said source and said drain is modulated as a result of a modulation of said magnetic field.

4. A quantum interference device according to claim 1, further comprising:

means for applying a light to said gate, whereby an electron current flowing between said source and said drain is modulated as a result of modulation of said light.

5. A quantum interference device according to claim 4, wherein the photon energy of the light applied is detuned from the difference between said first quantum energy level and said second quantum energy level.

6. A quantum interference device according to claim 1, comprising two pairs of said first and second electron waveguides.

7. A quantum interference device according to claim 1, wherein the following condition is met:

$$L_G \geq \pi/(2\kappa)$$

wherein $L_G$ represents the length of said gate as measured in the direction of propagation of said electron wave, and κ represents the coefficient of coupling between said first and second electron waveguides.

8. A quantum interference device according to claim 1, wherein each of said first and second electron waveguides includes a quantum line.

9. A quantum interference device according to claim 1 wherein said first and second quantum wells include first and second quantum well layers formed on a substrate, said quantum interference device further comprising a barrier layer provided between said first and second quantum well layers.

10. A quantum interference device according to claim 9, wherein said first and second quantum well layers have different thicknesses.

11. A quantum interference device according to claim 9, further comprising first and second clad layers which cooperate with each other in sandwiching therebetween said barrier layer and said first and second quantum well layers.

12. A quantum interference device according to claim 1, further comprising a back gate which cooperates with said gate electrode in sandwiching therebetween said first and second electron waveguides.

13. A quantum interference device according to claim 1, wherein said gate electrode includes a first gate electrode and a second gate electrode which are arranged side by side in the direction of propagation of the electron wave, said first and second gate electrodes being supplied with voltages independently of each other.

14. A quantum interference device according to claim 1, further comprising a sub-gate disposed between said source and said gate, said sub-gate transmitting to said gate only an electron wave of a predetermined energy level from among the electron waves from said source.

15. A quantum interference device according to claim 1, further comprising a sub-gate disposed between said drain and said gate, said sub-gate reflecting toward said gate only an electron wave of a predetermined energy level, from among the electron waves directed to said drain.

16. An optical detecting device, comprising:

a semiconductor member having a source, a gate and a drain, said source and drain comprising spaced regions of said semiconductor body, and said gate lying generally between the source and drain;

an electron waveguide structure extending between said source and said drain, said electron waveguide structure having a gate controlled channel portion immediately adjacent said gate and source and drain channel portions lying between said gate controlled channel portion and said source and drain, said electron waveguide structure comprising a pair of quantum confinement structures of a first semiconductor material each having a first dimension in a direction normal to the direction between said source and drain and being separated in said direction normal to the direction between said source and drain by a barrier layer having a second dimension in said direction normal to the direction between said source and drain, said barrier layer being made of a second semiconductor material having a lower affinity for electrons than said first semiconductor material, the difference in electron affinities between said first semiconductor material and said second semiconductor material and said first and second dimensions being such that, in said direction normal to the direction between said source and drain, energy levels for electrons in said electron waveguide structure are quantized into discrete energy levels, the lowest of said discrete energy levels having a quantum mechanical electron wave function which is generally symmetrical about said barrier layer in said direction normal to the direction between said source and drain, the next lowest of said discrete energy levels being generally antisymmetrical about said barrier layer in said direction normal to the direction between said source and said drain, so that said lowest energy level has a wavefunction which is coupled between said pair of quantum confinement structures, and so that said next lowest energy level has a wavefunction which, by reason of its generally antisymmetrical nature, has a value of zero within said barrier layer and antisymmetrical nodes in said pair of quantum confinement structures so that the wavefunction of said next lowest energy level is decoupled between said pair of quantum confinement structures;

said electron waveguide structure having a Fermi level for electrons;

said gate structure including an electrode; and means for applying a voltage to said electrode of said gate structure with respect to said source or said drain such that the energy of said next lowest energy level is shifted from an energy lying above the energy of said Fermi level to an energy lying below the energy of said Fermi level at the interface between said gate controlled channel portion and said source and drain channel portions, whereby electron waves in said electron waveguide structure are coupled between said pair of quantum confinement structures when said energy of said next lowest energy level is above the energy level of said Fermi level, and electron waves in said electron waveguide structure are decoupled between said pair of quantum confinement structures when said energy of said next lowest energy level is below the energy level of said Fermi level.

17. An optical communication system, comprising:

an optical signal transmitter which emits a light modulated in accordance with a communication signal; and an optical signal receiver having a photodetector for detecting said light from said optical transmitter;

wherein said optical detector comprises:

a semiconductor member having a source, a gate and a drain, said source and drain comprising spaced regions of said semiconductor body, and said gate lying generally between the source and drain;

an electron waveguide structure extending between said source and said drain, said electron waveguide structure having a gate controlled channel portion immediately adjacent said gate and source and drain channel portions lying between said gate controlled channel portion and said source and drain, said electron waveguide structure comprising a pair of quantum confinement structures of a first semiconductor material each having a first dimension in a direction normal to the direction between said source and drain and being separated in said direction normal to the direction between said source and drain by a barrier layer having a second dimension in said direction normal to the direction between said source and drain, said barrier layer being made of a second semiconductor material having a lower affinity for electrons than said first semiconductor material, the difference in electron affinities between said first semiconductor material and said second semiconductor material and said first and second dimensions being such that, in said direction normal to the direction between said source and drain, energy levels for electrons in said electron waveguide structure are quantized into discrete energy levels, the lowest of said discrete energy levels having a quantum mechanical electron wave function which is generally symmetrical about said barrier layer in said direction normal to the direction between said source and drain, the next lowest of said discrete energy levels being generally antisymmetrical about said barrier layer in said direction normal to the direction between said source and said drain, so that said lowest energy level has a wavefunction which is coupled between said pair of quantum confinement structures, and so that said next lowest energy level has a wavefunction which, by reason of its generally antisymmetrical nature, has a value of zero within said barrier layer and antisymmetrical nodes in said pair of quantum confinement structures so that the wavefunction of said next lowest energy level is decoupled between said pair of quantum confinement structures;

said electron waveguide structure having a Fermi level for electrons;

said gate structure including an electrode; and means for applying a voltage to said electrode of said gate structure with respect to said source or said drain such that the energy of said next lowest energy level is shifted from an energy lying above the energy of said Fermi level to an energy lying below the energy of said Fermi level at the interface between said gate controlled channel portion and said source and drain channel portions, whereby electron waves in said electron waveguide structure are coupled between said pair of quantum confinement structures when said energy of said next lowest energy level is above the energy level of said Fermi level, and electron waves in said electron waveguide structure are decoupled between said pair of quantum confinement structures when said energy of said next lowest energy level is below the energy level of said Fermi level.

18. An electron wave branching device comprising:

a pair of quantum confinement structures for propogating an electron wave of a first semiconductor material;

a source region for emitting the electron wave to said quantum confinement structures;

a drain region for draining the electron wave from said quantum confinement structures, said source and drain regions comprising spaced regions of said first semiconductor material; and a gate region, lying generally between the source and drain, having a gate electrode provided in the vicinity of said quantum confinement structures;

wherein each of said quantum confinement structures has a first dimension in a direction normal to the direction between said source region and said drain region and being separated in said direction normal to the direction between said source region and said drain region by a barrier layer having a second dimension in said direction normal to the direction between said source region and said drain region, said barrier layer being made of a second semiconductor material having a lower affinity for electrons than said first semiconductor material, the difference in electron affinities between said first semiconductor material and said second semiconductor material and said first and second dimensions being such that, in said direction normal to the direction between said source and drain, energy levels for electrons in said pair of quantum confinement structures are quantized into discrete energy levels, the lowest of said discrete energy levels having a quantum mechanical electron wave function which is generally symmetrical about said barrier layer in said direction normal to the direction between said source and drain, the next lowest of said discrete energy levels being generally antisymmetrical about said barrier layer in said direction normal to the direction between said source and said drain, so that said lowest energy level has a wavefunction which is coupled between said pair of quantum confinement structures, and so that said next lowest energy level has a wavefunction which, by reason of its generally antisymmetrical nature, has a value of zero within said barrier layer and antisymmetrical nodes in said pair of quantum confinement structures so that the wavefunction of said next lowest energy level is decoupled between said pair of quantum confinement structures; and wherein said pair of quantum confinement structures having a Fermi level for electrons; and wherein when a positive voltage is applied to said gate region, such that the energy of said next lowest energy level is shifted from an energy lying above the energy of said Fermi level to an energy lying below the energy of said Fermi level at the interface between said gate controlled channel portion and said source and drain channel portions, whereby electron waves are decoupled between said pair of quantum confinement structures when said energy of said next lowest energy level is below the energy level of said Fermi level.

19. An electron wave branching device according to claim 18, wherein said quantum confinement structures comprise a semiconductor substrate, a first clad layer provided on said substrate, a first quantum well layer provided on said first clad layer, a barrier layer provided on said first quantum well layer, a second quantum well layer provided on said barrier layer, and a second clad layer provided on said second quantum well layer, wherein bottom energy levels of the first clad layer, the second clad layer and the barrier layer are higher than bottom energy levels of the first and second quantum well layers in a conduction band.

20. An electron wave branching device according to claim 18, wherein each thickness of said first and second quantum well layers are different from each other.

21. An electron wave combining device comprising:

a pair of quantum confinement structures for propagating an electron wave of a first semiconductor material;

a source region for emitting the electron wave to said quantum confinement structures;

a drain region for draining the electron wave from said quantum confinement structures, said source and drain regions comprising spaced regions of said first semiconductor material; and a gate region, lying generally between the source and the drain having a gate electrode provided in the vicinity of said quantum confinement structures;

wherein each of said quantum confinement structures has a first dimension in a direction normal to the direction between said source region and said drain region and being separated in said direction normal to the direction between said source region and said drain region by a barrier layer having a second dimension in said direction normal to the direction between said source region and said drain region, said barrier layer being made of a second semiconductor material having a lower affinity for electrons than said first semiconductor material, the difference in electron affinities between said first semiconductor material and said second semiconductor material and said first and second dimensions being such that, in said direction normal to the direction between said source and drain, energy levels for electrons in said pair of quantum confinement structures are quantized into discrete energy levels, the lowest of said discrete energy levels having a quantum mechanical electron wave function which is generally symmetrical about said barrier layer in said direction normal to the direction between said source and drain, the next lowest of said discrete energy levels being generally antisymmetrical about said barrier layer in said direction normal to the direction between said source and said drain, so that said lowest energy level has a wavefunction which is coupled between said pair of quantum confinement structures, and so that said next lowest energy level has a wavefunction which, by reason of its generally antisymmetrical nature, has a value of zero within said barrier layer and antisymmetrical nodes in said pair of quantum confinement structures so that the wavefunction of said next lowest energy level is decoupled between said pair of quantum confinement structures; and wherein said pair of quantum confinement structures having a Fermi level for electrons; and wherein, when a negative voltage is applied to said gate region, such that the energy of said next lowest energy level is shifted from an energy lying above the energy of said Fermi level to an energy lying below the energy of said Fermi level at the interface between said gate controlled channel portion and said source and drain channel portions, whereby electron waves in said electron waveguide structure are coupled between said pair of quantum confinement structures when said energy of said next lowest energy level is above the energy level of said Fermi level electron waveguide.

22. An electron wave combining device according to claim 21, wherein said quantum confinement structures comprises a semiconductor substrate, a first clad layer provided on said substrate, a first quantum well layer provided on said first clad layer, a barrier layer provided on said first quantum well layer, a second quantum well layer provided on said barrier layer and a second clad layer provided on said second quantum well layer, wherein bottom energy levels of the first clad layer, the second clad layer and the barrier layer are higher than bottom energy levels of the first and second quantum well layers in a conduction band.

23. An electron wave combining device according to claim 22, wherein each thickness of said first and second quantum well layers are different from each other.

* * * * *

UNITED STATES PATENT AND TRADEMARK OFFICE
CERTIFICATE OF CORRECTION

PATENT NO. : 5,521,735
DATED : May 28, 1996
INVENTOR(S) : AKIRA SHIMIZU, et al.

Page 1 of 3

It is certified that error appears in the above-indentified patent and that said Letters Patent is hereby corrected as shown below:

ON THE COVER PAGE

Item [56] References Cited

FOREIGN PATENT DOCUMENTS

"1129477    5/1989    Japan
 1226182    9/1989    Japan
 2130964    5/1990    Japan
 2200008    8/1990    Japan" should read
 --1-129477  5/1989    Japan
   1-226182  9/1989    Japan
   2-130964  5/1990    Japan
   2-200008  8/1990    Japan--.

COLUMN 3

Line 26, "to" (second occurrence) should read --of--.
Line 36, "to" (second occurrence) should read --of--.
Line 42, "maveguides" should read --waveguides--.
Line 44, "laves" should read --waves--.
Line 46, "to" (second occurrence) should read --of--.
Line 58, "to" (second occurrence) should read --of--.

COLUMN 4

Line 4, "to" (second occurrence) should read --of--.
Line 16, "to" (second occurrence) should read --of--.

COLUMN 6

Line 55, "necessary" should read --necessary that--.

UNITED STATES PATENT AND TRADEMARK OFFICE
CERTIFICATE OF CORRECTION

PATENT NO. : 5,521,735                    Page 2 of 3
DATED      : May 28, 1996
INVENTOR(S): AKIRA SHIMIZU, et al.

It is certified that error appears in the above-indentified patent and that said Letters Patent is hereby corrected as shown below:

COLUMN 8

Line 62, "volt age $V_G$" should read --voltage $V_G$--.

COLUMN 10

Line 1, "FIG. 18" should read --FIG. 18,--.

COLUMN 11

Line 26, "have" should be deleted.

COLUMN 12

Line 14, "well" should read --well 81--.

COLUMN 13

Line 9, "haing" should read --having--.

COLUMN 14

Line 23, "contrast,," should read --contrast,--.

UNITED STATES PATENT AND TRADEMARK OFFICE
CERTIFICATE OF CORRECTION

PATENT NO. : 5,521,735      Page 3 of 3

DATED : May 28, 1996

INVENTOR(S) : AKIRA SHIMIZU, et al.

It is certified that error appears in the above-indentified patent and that said Letters Patent is hereby corrected as shown below:

COLUMN 15

Line 1, "such" should read --such a--.

Signed and Sealed this

Twenty-fourth Day of September, 1996

Attest:

BRUCE LEHMAN

Attesting Officer     Commissioner of Patents and Trademarks